(12) United States Patent
Lee

(10) Patent No.: US 9,912,883 B1
(45) Date of Patent: Mar. 6, 2018

(54) IMAGE SENSOR WITH CALIBRATED COLUMN ANALOG-TO-DIGITAL CONVERTERS

(71) Applicant: Apple Inc., Cupertino, CA (US)

(72) Inventor: Bumha Lee, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/590,775

(22) Filed: May 9, 2017

Related U.S. Application Data

(60) Provisional application No. 62/334,426, filed on May 10, 2016.

(51) Int. Cl.
| | |
|---|---|
| *H03M 1/56* | (2006.01) |
| *H04N 5/335* | (2011.01) |
| *H04N 5/378* | (2011.01) |
| *H04N 5/3745* | (2011.01) |
| *H03M 1/12* | (2006.01) |

(52) U.S. Cl.
CPC .............. *H04N 5/335* (2013.01); *H03M 1/12* (2013.01); *H03M 1/56* (2013.01); *H04N 5/378* (2013.01); *H04N 5/37455* (2013.01)

(58) Field of Classification Search
CPC ......... H03M 1/56; H03M 1/123; H03M 1/12; H03M 1/34; H03M 1/145; H03M 1/468; H03M 1/00; H03M 1/1023; H03M 1/002; H03M 1/0658; H03M 1/08; H03M 1/1205; H03M 1/129; H03M 1/14; H03M 1/46; H03M 1/745; H03M 1/1014; H04N 5/378; H04N 5/23212; H04N 5/335; H04N 9/045; H04N 5/37455

USPC .................. 341/118, 120, 155, 167–170
See application file for complete search history.

(56) References Cited

U.S. PATENT DOCUMENTS

| | | | |
|---|---|---|---|
| 4,686,572 A | 8/1987 | Takatsu | |
| 4,686,648 A | 8/1987 | Fossum | |
| 5,105,264 A | 4/1992 | Erhardt et al. | |
| 5,329,313 A | 7/1994 | Keith | |
| 5,396,893 A | 3/1995 | Oberg et al. | |
| 5,471,515 A | 11/1995 | Fossum et al. | |

(Continued)

FOREIGN PATENT DOCUMENTS

| | | |
|---|---|---|
| CN | 1630350 | 6/2005 |
| CN | 1833429 | 9/2006 |

(Continued)

OTHER PUBLICATIONS

Aoki, et al., "Rolling-Shutter Distortion-Free 3D Stacked Image Sensor with -160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.

(Continued)

*Primary Examiner* — Linh Nguyen
(74) *Attorney, Agent, or Firm* — Brownstein Hyatt Farber Schreck, LLP

(57) ABSTRACT

Image sensors using multiple-ramp single slope analog to digital converters (ADCs) and method of their operation are disclosed. The images sensors use additional column ADCs to detect offset errors in the fine ramp signals and feedback in the analog domain to correct the errors. Averaging errors over multiple analog-to-digital conversion cycles allows for improved error correction.

20 Claims, 14 Drawing Sheets

(56) References Cited

U.S. PATENT DOCUMENTS

| | | | |
|---|---|---|---|
| 5,541,402 A | 7/1996 | Ackland | |
| 5,550,677 A | 8/1996 | Schofield et al. | |
| 5,781,312 A | 7/1998 | Noda | |
| 5,841,126 A | 11/1998 | Fossum et al. | |
| 5,880,459 A | 3/1999 | Pryor et al. | |
| 5,949,483 A | 9/1999 | Fossum et al. | |
| 6,008,486 A | 12/1999 | Stam et al. | |
| 6,040,568 A | 3/2000 | Caulfield et al. | |
| 6,233,013 B1 | 5/2001 | Hosier et al. | |
| 6,348,929 B1 | 2/2002 | Acharya et al. | |
| 6,448,550 B1 | 9/2002 | Nishimura | |
| 6,528,833 B2 | 3/2003 | Lee et al. | |
| 6,541,751 B1 | 4/2003 | Bidermann | |
| 6,670,904 B1* | 12/2003 | Yakovlev | H03M 1/144 341/165 |
| 6,713,796 B1 | 3/2004 | Fox | |
| 6,714,239 B2 | 3/2004 | Guidash | |
| 6,798,453 B1 | 9/2004 | Kaifu | |
| 6,816,676 B2 | 11/2004 | Bianchi et al. | |
| 6,905,470 B2 | 6/2005 | Lee et al. | |
| 6,931,269 B2 | 8/2005 | Terry | |
| 6,956,605 B1 | 10/2005 | Hashimoto | |
| 6,982,759 B2 | 1/2006 | Goto | |
| 7,075,049 B2 | 7/2006 | Rhodes et al. | |
| 7,091,466 B2 | 8/2006 | Bock | |
| 7,119,322 B2 | 10/2006 | Hong | |
| 7,133,073 B1 | 11/2006 | Neter | |
| 7,259,413 B2 | 8/2007 | Rhodes | |
| 7,262,401 B2 | 8/2007 | Hopper et al. | |
| 7,271,835 B2 | 9/2007 | Iizuka | |
| 7,282,028 B2 | 10/2007 | Kim et al. | |
| 7,332,786 B2 | 2/2008 | Altice | |
| 7,390,687 B2 | 6/2008 | Boettiger | |
| 7,415,096 B2 | 8/2008 | Sherman | |
| 7,437,013 B2 | 10/2008 | Anderson | |
| 7,443,421 B2 | 10/2008 | Stavely et al. | |
| 7,446,812 B2 | 11/2008 | Ando et al. | |
| 7,471,315 B2 | 12/2008 | Silsby et al. | |
| 7,502,054 B2 | 3/2009 | Kalapathy | |
| 7,525,168 B2 | 4/2009 | Hsieh | |
| 7,554,067 B2 | 6/2009 | Zarnoski et al. | |
| 7,555,158 B2 | 6/2009 | Park et al. | |
| 7,622,699 B2 | 11/2009 | Sakakibara et al. | |
| 7,626,626 B2 | 12/2009 | Panicacci | |
| 7,636,109 B2 | 12/2009 | Nakajima et al. | |
| 7,667,400 B1 | 2/2010 | Goushcha | |
| 7,671,435 B2 | 3/2010 | Ahn | |
| 7,714,292 B2 | 5/2010 | Agarwal et al. | |
| 7,728,351 B2 | 6/2010 | Shim | |
| 7,733,402 B2 | 6/2010 | Egawa et al. | |
| 7,742,090 B2 | 6/2010 | Street | |
| 7,764,312 B2 | 7/2010 | Ono et al. | |
| 7,773,138 B2 | 8/2010 | Lahav et al. | |
| 7,786,543 B2 | 8/2010 | Hsieh | |
| 7,796,171 B2 | 9/2010 | Gardner | |
| 7,817,198 B2 | 10/2010 | Kang et al. | |
| 7,838,956 B2 | 11/2010 | McCarten et al. | |
| 7,873,236 B2 | 1/2011 | Li et al. | |
| 7,880,785 B2 | 2/2011 | Gallagher | |
| 7,884,402 B2 | 2/2011 | Ki | |
| 7,906,826 B2 | 3/2011 | Martin et al. | |
| 7,952,121 B2 | 5/2011 | Arimoto | |
| 7,952,635 B2 | 5/2011 | Lauxtermann | |
| 7,982,789 B2 | 7/2011 | Watanabe et al. | |
| 8,026,966 B2 | 9/2011 | Altice | |
| 8,032,206 B1 | 10/2011 | Farazi et al. | |
| 8,089,036 B2 | 1/2012 | Manabe et al. | |
| 8,089,524 B2 | 1/2012 | Urisaka | |
| 8,094,232 B2 | 1/2012 | Kusaka | |
| 8,116,540 B2 | 2/2012 | Dean | |
| 8,140,143 B2 | 3/2012 | Picard et al. | |
| 8,153,947 B2 | 4/2012 | Barbier et al. | |
| 8,159,570 B2 | 4/2012 | Negishi | |
| 8,159,588 B2 | 4/2012 | Boemler | |
| 8,164,669 B2 | 4/2012 | Compton et al. | |
| 8,174,595 B2 | 5/2012 | Honda et al. | |
| 8,184,188 B2 | 5/2012 | Yaghmai | |
| 8,194,148 B2 | 6/2012 | Doida | |
| 8,194,165 B2 | 6/2012 | Border et al. | |
| 8,222,586 B2 | 7/2012 | Lee | |
| 8,227,844 B2 | 7/2012 | Adkisson | |
| 8,233,071 B2 | 7/2012 | Takeda | |
| 8,259,228 B2 | 9/2012 | Wei et al. | |
| 8,310,577 B1 | 11/2012 | Neter | |
| 8,324,553 B2 | 12/2012 | Lee | |
| 8,338,856 B2 | 12/2012 | Tai et al. | |
| 8,340,407 B2 | 12/2012 | Kalman | |
| 8,350,940 B2 | 1/2013 | Smith et al. | |
| 8,388,346 B2 | 3/2013 | Rantala et al. | |
| 8,400,546 B2 | 3/2013 | Itano et al. | |
| 8,456,540 B2 | 6/2013 | Egawa | |
| 8,456,559 B2 | 6/2013 | Yamashita | |
| 8,508,637 B2 | 8/2013 | Han et al. | |
| 8,514,308 B2 | 8/2013 | Itonaga et al. | |
| 8,520,913 B2 | 8/2013 | Dean | |
| 8,547,388 B2 | 10/2013 | Cheng | |
| 8,575,531 B2 | 11/2013 | Hynecek et al. | |
| 8,581,992 B2 | 11/2013 | Hamada | |
| 8,594,170 B2 | 11/2013 | Mombers et al. | |
| 8,619,163 B2 | 12/2013 | Ogua | |
| 8,619,170 B2 | 12/2013 | Mabuchi | |
| 8,629,484 B2 | 1/2014 | Ohri et al. | |
| 8,634,002 B2 | 1/2014 | Kita | |
| 8,648,947 B2 | 2/2014 | Sato et al. | |
| 8,723,975 B2 | 5/2014 | Solhusvik | |
| 8,730,345 B2 | 5/2014 | Watanabe | |
| 8,754,983 B2 | 6/2014 | Sutton | |
| 8,755,854 B2 | 6/2014 | Addison et al. | |
| 8,759,736 B2* | 6/2014 | Yoo | H04N 5/3742 250/208.1 |
| 8,760,413 B2 | 6/2014 | Peterson et al. | |
| 8,767,104 B2* | 7/2014 | Makino | H04N 5/3454 348/294 |
| 8,803,990 B2 | 8/2014 | Smith | |
| 8,817,154 B2 | 8/2014 | Manabe et al. | |
| 8,902,330 B2 | 12/2014 | Theuwissen | |
| 8,908,073 B2 | 12/2014 | Minagawa | |
| 8,934,030 B2 | 1/2015 | Kim et al. | |
| 8,936,552 B2 | 1/2015 | Kateraas et al. | |
| 8,946,610 B2 | 2/2015 | Iwabuchi et al. | |
| 8,982,237 B2 | 3/2015 | Chen | |
| 9,041,837 B2 | 5/2015 | Li | |
| 9,017,748 B2 | 6/2015 | Theuwissen | |
| 9,054,009 B2 | 6/2015 | Oike et al. | |
| 9,066,017 B2 | 6/2015 | Geiss | |
| 9,066,660 B2 | 6/2015 | Watson et al. | |
| 9,088,727 B2 | 7/2015 | Trumbo | |
| 9,094,623 B2 | 7/2015 | Kawaguchi | |
| 9,099,604 B2 | 8/2015 | Roy | |
| 9,100,597 B2 | 8/2015 | Hu | |
| 9,131,171 B2 | 9/2015 | Aoki et al. | |
| 9,154,750 B2 | 10/2015 | Pang | |
| 9,178,100 B2 | 11/2015 | Webster et al. | |
| 9,209,320 B1 | 12/2015 | Webster | |
| 9,225,948 B2 | 12/2015 | Hasegawa | |
| 9,232,150 B2 | 1/2016 | Kleekajai et al. | |
| 9,235,267 B2 | 1/2016 | Burrough et al. | |
| 9,270,906 B2 | 2/2016 | Peng et al. | |
| 9,276,031 B2 | 3/2016 | Wan | |
| 9,277,144 B2 | 3/2016 | Kleekajai et al. | |
| 9,288,404 B2 | 3/2016 | Papiashvili | |
| 9,293,500 B2 | 3/2016 | Sharma et al. | |
| 9,319,611 B2 | 4/2016 | Fan | |
| 9,331,116 B2 | 5/2016 | Webster | |
| 9,344,649 B2 | 5/2016 | Bock | |
| 9,392,237 B2 | 7/2016 | Toyoda | |
| 9,451,887 B2 | 9/2016 | Watson et al. | |
| 9,467,553 B2 | 10/2016 | Heo et al. | |
| 9,473,706 B2 | 10/2016 | Malone et al. | |
| 9,479,688 B2 | 10/2016 | Ishii | |
| 9,490,285 B2 | 11/2016 | Itonaga | |
| 9,497,397 B1 | 11/2016 | Kleekajai et al. | |
| 9,503,616 B2 | 11/2016 | Taniguchi et al. | |
| 9,538,106 B2 | 1/2017 | McMahon et al. | |

(56) References Cited

U.S. PATENT DOCUMENTS

| | | |
|---|---|---|
| 9,549,099 B2 | 1/2017 | Fan |
| 9,584,743 B1 | 2/2017 | Lin et al. |
| 9,596,420 B2 | 3/2017 | Fan et al. |
| 9,596,423 B1 | 3/2017 | Molgaard |
| 9,774,318 B2* | 9/2017 | Song .................. H03K 4/48 |
| 9,781,368 B2* | 10/2017 | Song .................. H04N 5/3698 |
| 2003/0036685 A1 | 2/2003 | Goodman et al. |
| 2004/0207836 A1 | 10/2004 | Chhibber et al. |
| 2005/0026332 A1 | 2/2005 | Fratti et al. |
| 2006/0274161 A1 | 12/2006 | Ing et al. |
| 2007/0263099 A1 | 11/2007 | Motta et al. |
| 2008/0177162 A1 | 7/2008 | Bae et al. |
| 2008/0315198 A1 | 12/2008 | Jung |
| 2009/0096901 A1 | 4/2009 | Bae et al. |
| 2009/0101914 A1 | 4/2009 | Hirotsu et al. |
| 2009/0146234 A1 | 6/2009 | Luo et al. |
| 2009/0201400 A1 | 8/2009 | Zhang et al. |
| 2009/0219266 A1 | 9/2009 | Lim et al. |
| 2010/0134631 A1 | 6/2010 | Voth |
| 2011/0080500 A1 | 4/2011 | Wang et al. |
| 2011/0156197 A1 | 6/2011 | Tivarus et al. |
| 2011/0164162 A1 | 7/2011 | Kato |
| 2011/0193824 A1 | 8/2011 | Modarres et al. |
| 2012/0092541 A1 | 4/2012 | Tuulos et al. |
| 2012/0098964 A1 | 4/2012 | Oggier et al. |
| 2012/0127088 A1 | 5/2012 | Pance et al. |
| 2013/0112852 A1* | 5/2013 | Kizuna ............... H04N 5/378 250/208.1 |
| 2013/0147981 A1 | 6/2013 | Wu |
| 2014/0049683 A1 | 2/2014 | Guenter |
| 2014/0071321 A1 | 3/2014 | Seyama |
| 2014/0132528 A1 | 5/2014 | Catton |
| 2014/0252201 A1 | 9/2014 | Li et al. |
| 2015/0163392 A1 | 6/2015 | Malone et al. |
| 2015/0163422 A1 | 6/2015 | Fan et al. |
| 2015/0277559 A1 | 10/2015 | Vescovi et al. |
| 2015/0312479 A1 | 10/2015 | McMahon et al. |
| 2015/0350575 A1 | 12/2015 | Agranov et al. |
| 2016/0050379 A1 | 2/2016 | Jiang et al. |
| 2016/0099371 A1 | 4/2016 | Webster |
| 2016/0205311 A1 | 7/2016 | Mandelli et al. |
| 2016/0219232 A1 | 7/2016 | Murata |
| 2016/0248409 A1* | 8/2016 | Song .................. H03K 4/48 |
| 2016/0269039 A1* | 9/2016 | Yoo .................. H03M 1/145 |
| 2016/0365380 A1 | 12/2016 | Wan |
| 2017/0047363 A1 | 2/2017 | Choi et al. |
| 2017/0084133 A1 | 3/2017 | Cardinali et al. |
| 2017/0223292 A1* | 8/2017 | Ikeda ............ H04N 5/35563 |
| 2017/0272675 A1* | 9/2017 | Kobayashi ........... H04N 5/361 |
| 2017/0373106 A1 | 12/2017 | Li et al. |

FOREIGN PATENT DOCUMENTS

| | | |
|---|---|---|
| CN | 1842138 | 10/2006 |
| CN | 1947414 | 4/2007 |
| CN | 101189885 | 5/2008 |
| CN | 101233763 | 7/2008 |
| CN | 101472059 | 7/2009 |
| CN | 101567977 | 10/2009 |
| CN | 101622859 | 1/2010 |
| CN | 101754029 | 6/2010 |
| CN | 101803925 | 8/2010 |
| CN | 102036020 | 4/2011 |
| CN | 102208423 | 10/2011 |
| CN | 102451160 | 5/2012 |
| CN | 102668542 | 9/2012 |
| CN | 102821255 | 12/2012 |
| CN | 103024297 | 4/2013 |
| CN | 103051843 | 4/2013 |
| CN | 103329513 | 9/2013 |
| CN | 103546702 | 1/2014 |
| CN | 204761615 | 11/2015 |
| EP | 1763228 | 3/2007 |
| EP | 2023611 | 2/2009 |
| EP | 2107610 | 10/2009 |
| EP | 2230690 | 9/2010 |
| EP | 2512126 | 10/2012 |
| EP | 2787531 | 10/2014 |
| JP | S61123287 | 6/1986 |
| JP | 2007504670 | 8/1987 |
| JP | 2000059697 | 2/2000 |
| JP | 2001211455 | 8/2001 |
| JP | 2001358994 | 12/2001 |
| JP | 2004111590 | 4/2004 |
| JP | 2005318504 | 11/2005 |
| JP | 2006287361 | 10/2006 |
| JP | 2007516654 | 6/2007 |
| JP | 2008507908 | 3/2008 |
| JP | 2008271280 | 11/2008 |
| JP | 2008543061 | 11/2008 |
| JP | 2009021809 | 1/2009 |
| JP | 2009159186 | 7/2009 |
| JP | 2009212909 | 9/2009 |
| JP | 2009296465 | 12/2009 |
| JP | 2010080604 | 4/2010 |
| JP | 2010114834 | 5/2010 |
| JP | 2011040926 | 2/2011 |
| JP | 201149697 | 3/2011 |
| JP | 2011091775 | 5/2011 |
| JP | 2011097646 | 12/2011 |
| JP | 2012010306 | 1/2012 |
| JP | 2012019516 | 1/2012 |
| JP | 2012513160 | 6/2012 |
| JP | 2013051523 | 3/2013 |
| JP | 2013070240 | 4/2013 |
| JP | 2013529035 | 7/2013 |
| KR | 20030034424 | 5/2003 |
| KR | 20030061157 | 7/2003 |
| KR | 20050103732 | 11/2005 |
| KR | 2008/0069851 | 7/2008 |
| KR | 20100008239 | 1/2010 |
| KR | 20100065084 | 6/2010 |
| KR | 20130074459 | 7/2013 |
| TW | 200520551 | 6/2005 |
| TW | 201110689 | 3/2011 |
| TW | 201301881 | 1/2013 |
| WO | WO 05/041304 | 5/2005 |
| WO | WO 06/014641 | 2/2006 |
| WO | WO 06/130443 | 12/2006 |
| WO | WO 07/049900 | 5/2007 |
| WO | WO 10/120945 | 10/2010 |
| WO | WO 12/032353 | 3/2012 |
| WO | WO 12/053363 | 4/2012 |
| WO | WO 12/088338 | 6/2012 |
| WO | WO 12/122572 | 9/2012 |
| WO | WO 12/138687 | 10/2012 |
| WO | WO 13/008425 | 1/2013 |
| WO | WO 13/179018 | 12/2013 |
| WO | WO 13/179020 | 12/2013 |

OTHER PUBLICATIONS

Elgendi, "On the Analysis of Fingertip Photoplethysmogram Signals," *Current Cardiology Reviews*, 2012, vol. 8, pp. 14-25.

Feng, et al., "On the Stoney Formula for a Thin Film/Substrate System with Nonuniform Substrate Thickness," *Journal of Applied Mechanics*, Transactions of the ASME, vol. 74, Nov. 2007, pp. 1276-1281.

Fu, et al., "Heart Rate Extraction from Photoplethysmogram Waveform Using Wavelet Multui-resolution Analysis," *Journal of Medical and Biological Engineering*, 2008, vol. 28, No. 4, pp. 229-232.

Han, et al., "Artifacts in wearable photoplethysmographs during daily life motions and their reduction with least mean square based active noise cancellation method," *Computers in Biology and Medicine*, 2012, vol. 42, pp. 387-393.

Lopez-Silva, et al., "Heuristic Algorithm for Photoplethysmographic Heart Rate Tracking During Maximal Exercise Test," *Journal of Medical and Biological Engineering*, 2011, vol. 12, No. 3, pp. 181-188.

Santos, et al., "Accelerometer-assisted PPG Measurement During Physical Exercise Using the LAVIMO Sensor System," *Acta Polytechnica*, 2012, vol. 52, No. 5, pp. 80-85.

(56) References Cited

OTHER PUBLICATIONS

Sarkar, et al., "Fingertip Pulse Wave (PPG signal) Analysis and Heart Rate Detection," *International Journal of Emerging Technology and Advanced Engineering*, 2012, vol. 2, No. 9, pp. 404-407.
Schwarzer, et al., On the determination of film stress from substrate bending: Stoney'S formula and its limits, Jan. 2006, 19 pages.
Yan, et al., "Reduction of motion artifact in pulse oximetry by smoothed pseudo Wigner-Ville distribution," *Journal of NeuroEngineering and Rehabilitation*, 2005, vol. 2, No. 3, pp. 1-9.
Yousefi, et al., "Adaptive Cancellation of Motion Artifact in Wearable Biosensors," 34th Annual International Conference of the IEEE EMBS, San Diego, California, Aug./Sep. 2012, pp. 2004-2008.
U.S. Appl. No. 15/627,409, filed Jun. 19, 2017, Agranov et al.
Shen et al., "Stresses, Curvatures, and Shape Changes Arising from Patterned Lines on Silicon Wafers," Journal of Applied Physics, vol. 80, No. 3, Aug. 1996, pp. 1388-1398.

* cited by examiner

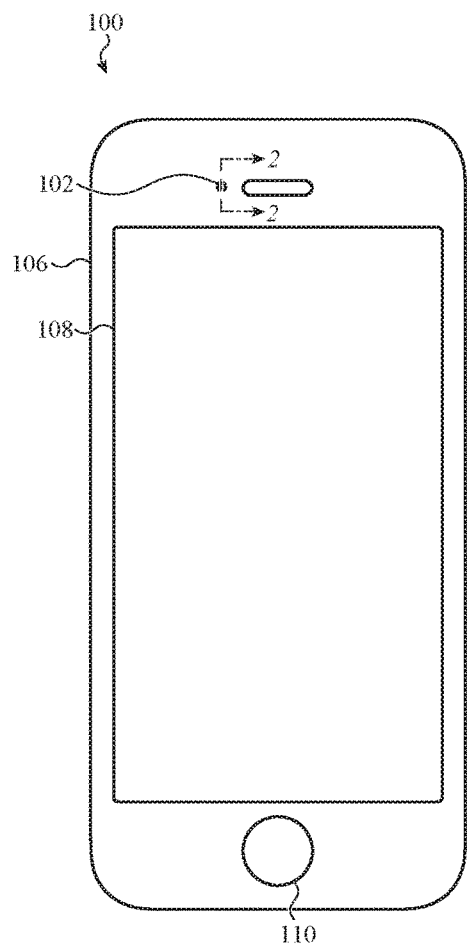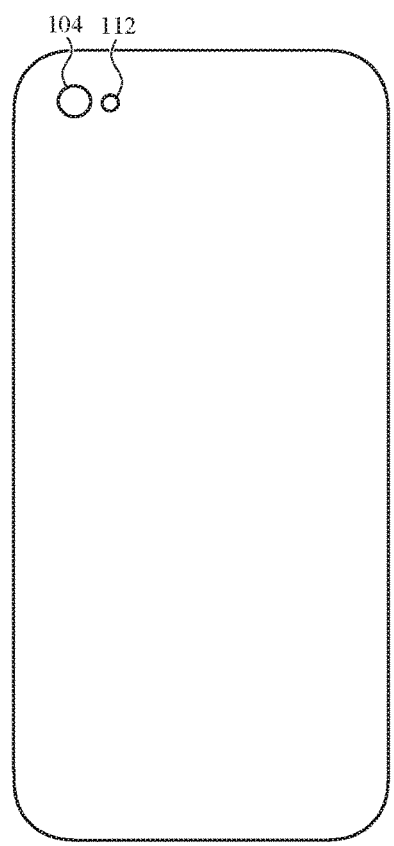
*FIG. 1A*  *FIG. 1B*

IMAGE SENSOR WITH CALIBRATED COLUMN ANALOG-TO-DIGITAL CONVERTERS

CROSS-REFERENCE TO RELATED APPLICATION(S)

This application claims the benefit under 35 U.S.C. §119 (e) of U.S. Provisional Patent Application No. 62/334,426, filed on May 10, 2016, and entitled "Image Sensor With Calibrated Column Analog-to-Digital Converters," which is incorporated by reference as if fully disclosed herein.

FIELD

The described embodiments relate generally to image sensors used in various image capture devices. Some embodiments relate more specifically to architectures for analog-to-digital converters (ADC) in image sensors having an array of pixels.

BACKGROUND

An image sensor typically includes an array of pixels. When an image of a scene is to be captured by the image sensor, each pixel accumulates photo-generated charge based on the amount of light striking the pixel. Column circuits connected to the pixels receive voltage signals from the pixels and convert the voltage signals into digital signals using analog-to-digital converters (ADCs) included in each column circuit. The digital signals are then combined to produce the captured image.

Single slope ADCs are used in many image sensors due at least in part to their linearity and to their limited power consumption. However, for some image sensors, such as large pixel array image sensors, the single slope ADCs can take a relatively long time to convert all of the voltage signals into digital signals. Several readout techniques have been used to reduce the conversion time of the single slop ADCs. One technique places column circuits on two sides of the pixel array (e.g., top and bottom) to improve the readout throughput. Some of the pixels are readout by the column circuits on one side of the pixel array while the remaining pixels are readout by the column circuits on the other side of the pixel array.

Another technique uses multiple banks or groups of column circuits and staggers the use of the column circuits with respect to time. One group of column circuits reads the voltage signals from the pixels while another group of column circuits converts the voltage signals into digital signals. However, both of these techniques can increase the column fixed pattern noise in the digital signals, consume a greater amount of die area, and increase the amount of power consumed by the column circuits.

SUMMARY

Embodiments described herein relate to image sensors, including those that use multiple-ramp single slope (MRSS) analog to digital converters (ADC) for processing pixel arrays data.

In one embodiment, an image sensor includes an array of pixels configured in multiple columns. The image sensor uses an MRSS ADC in each column. The image sensor includes an additional number of column ADCs for sampling the fine ramp signals of the MRSS ADC process to detect errors, such as offset, spacing or timing errors, in the fine ramp signals. The detected errors are used by feedback circuitry to modify one or more fine ramp signal generators in the analog domain. Further embodiments use detection of errors in the fine ramp signals over multiple analog-to-digital (A/D) conversions to obtain improved error estimation and correction.

Another embodiment discloses a method of operating an image sensor that uses MRSS ADC. The method includes receiving an initiation signal, and performing an initial error measurement using additional column ADC to measure errors in the fine ramp signals. An initial analog error correction is performed using the initial error measurement. Thereafter subsequent ramp signal errors can be continually measured over subsequent A/D conversion periods. This can refine the error measurement values to allow for improved error correction. In some embodiments analog error correction can include any of: adjusting an offset voltage applied to an amplifier of a fine ramp generator or adjusting a current source of a fine ramp generator.

Another embodiment is of an electronic device comprising a camera that contains an image sensor that uses MRSS ADC for processing data from an array of pixels, and an image processor for control of the image sensor. The image sensor includes a second set of column analog ADC configured to measure the fine ramp signals. The image sensor includes an error detection circuit to determine one or more errors in the fine ramp signals and feedback circuitry that can reduce the errors in the fine ramp signals based on the determined error.

BRIEF DESCRIPTION OF THE DRAWINGS

The disclosure will be readily understood by the following detailed description in conjunction with the accompanying drawings, wherein like reference numerals designate like structural elements, and in which:

FIGS. 1A-1B depict front and rear views of an example electronic device that can include one or more image sensors;

Figure 2:
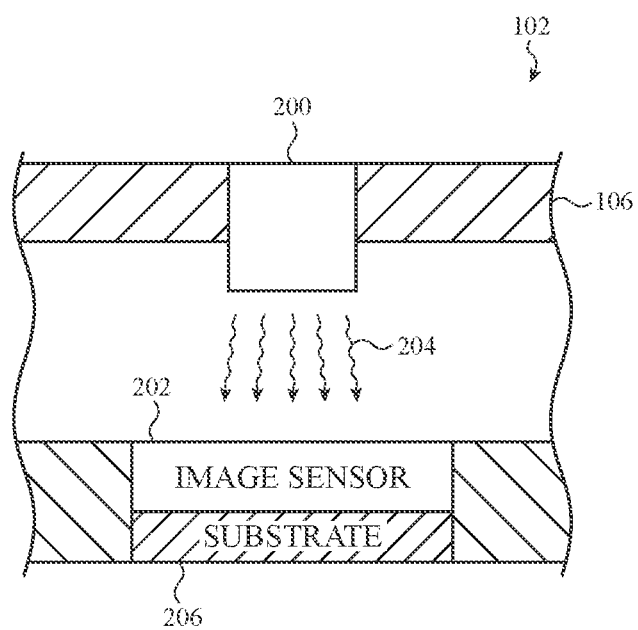
FIG. 2 shows a cross-section view of the electronic device taken along line 2-2 in FIG. 1A.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to an image sensor that includes multiple-ramp single slope analog-to-digital converters (MRSS ADCs) in the column circuits. As explained below, ideal analog to digital conversion in such architectures requires precise generation of the coarse and fine ramp signals.

As imperfections in timing and signal generation can occur, this disclosure provides architectures and methods for detecting offsets or other inaccuracies in the coarse and fine ramp signals. Some embodiments provide additional column ADCs for detection of errors in the fine ramp signals.

This disclosure also provides calibration techniques for the MRSS ADCs that make use of the detected inaccuracies. In some embodiments the calibration techniques use feedback of the detected inaccuracies into the analog stages. In some embodiments the feedback is into the fine ramp signal generators.

In some embodiments offset or spacing errors between fine ramp signals are determined over multiple analog-to-digital (A/D) conversion periods. Detecting and correcting such errors in the fine ramp signals over a single A/D conversion period can allow for increasing conversion accuracy to 1 least significant bit (LSB). However, when such errors are measured and averaged over multiple A/D conversion periods it can be possible to obtain conversion accuracy to less than 1 LSB. Such accuracy allows for more accurate reconstruction of images acquired with the image sensors. It can eliminate artifacts such as visible lines or streaks in the reconstructed images.

These and other embodiments are discussed below with reference to FIGS. 1-12. However, those skilled in the art will readily appreciate that the detailed description given herein with respect to these Figures is for explanatory purposes only and should not be construed as limiting.

FIGS. 1A-1B depict front and rear views of an example electronic device that can include one or more image sensors. The electronic device 100 includes a first camera 102, a second camera 104, an enclosure 106, a display 108, an input/output (I/O) device 110, and an optional flash 112 or light source for the camera or cameras. The electronic device 100 can also include one or more internal components (not shown) typical of a computing or electronic device, such as, for example, one or more processors or processing devices, memory components, network interfaces, and so on.

In the illustrated embodiment, the electronic device 100 is depicted as a smart telephone. Other embodiments, however, are not limited to this construction. Other types of computing or electronic devices can include one or more cameras. Examples of such electronic devices include, but are not limited to, laptop computer, tablet computing devices, digital cameras, wearable electronics or communication devices, scanners, video recorders, and copiers.

The enclosure 106 can form an outer surface or partial outer surface for the internal components of the electronic device 100, and may support and/or at least partially surround the display 108 and the I/O device 110. The enclosure 106 can be formed of one or more components operably connected together, such as a front piece and a back piece. Alternatively, the enclosure 106 can be formed of a single piece operably connected to the display 108.

The I/O device 110 can be implemented with any type of input and/or output device. By way of example only, the I/O device 110 is shown as a button, but in other embodiments the I/O device can be a switch, a capacitive sensor, or other input mechanism. The I/O device 110 allows a user to interact with the electronic device 100. For example, the I/O device 110 may be a button or switch to alter the volume, return to a home screen, and the like.

In some embodiments, the electronic device 100 can include one or more input devices, output devices, and/or I/O devices, and each device can have a single function or multiple functions. Example input, output, and I/O devices include, but are not limited to, a microphone, speakers, a touch sensor, network or communication ports, and wireless communication devices.

The display 108 can provide a visual output for the electronic device 100. The display 108 can be implemented with any type of suitable display element, such as a retina display, a color liquid crystal display (LCD) element, or an organic light-emitting display (OLED) element. In some embodiments, the display 108 can be configured to receive user inputs to the electronic device 100. For example, the display 108 can be a multi-touch capacitive touchscreen that can detect one or more user touch and/or force inputs.

FIG. 2 is a simplified cross-section view of the electronic device taken along line 2-2 in FIG. 1A. Although FIG. 2 illustrates the first camera 102, those skilled in the art will recognize that the second camera 104 can be substantially similar to the first camera 102. In some embodiments, one camera may include a global shutter configured image sensor and one camera can include a rolling shutter configured image sensor. In other examples, one camera can include an image sensor with a higher resolution than the image sensor in the other camera, or the image sensors can be configured as two different types of image sensors (e.g., CMOS and CCD).

The camera 102 includes an imaging stage 200 that is in optical communication with an image sensor 202. The imaging stage 200 is operably connected to the enclosure 106 and positioned in front of the image sensor 202. The imaging stage 200 can include conventional elements such as a lens, a filter, an iris, and a shutter. The imaging stage 200 directs, focuses, and/or transmits light 204 within its field of view onto the image sensor 202. The image sensor 202 captures one or more images of a subject scene by converting the incident light into electrical signals.

The image sensor 202 is formed in and/or supported by a support structure 206. The support structure 206 can be a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Figure 3A:
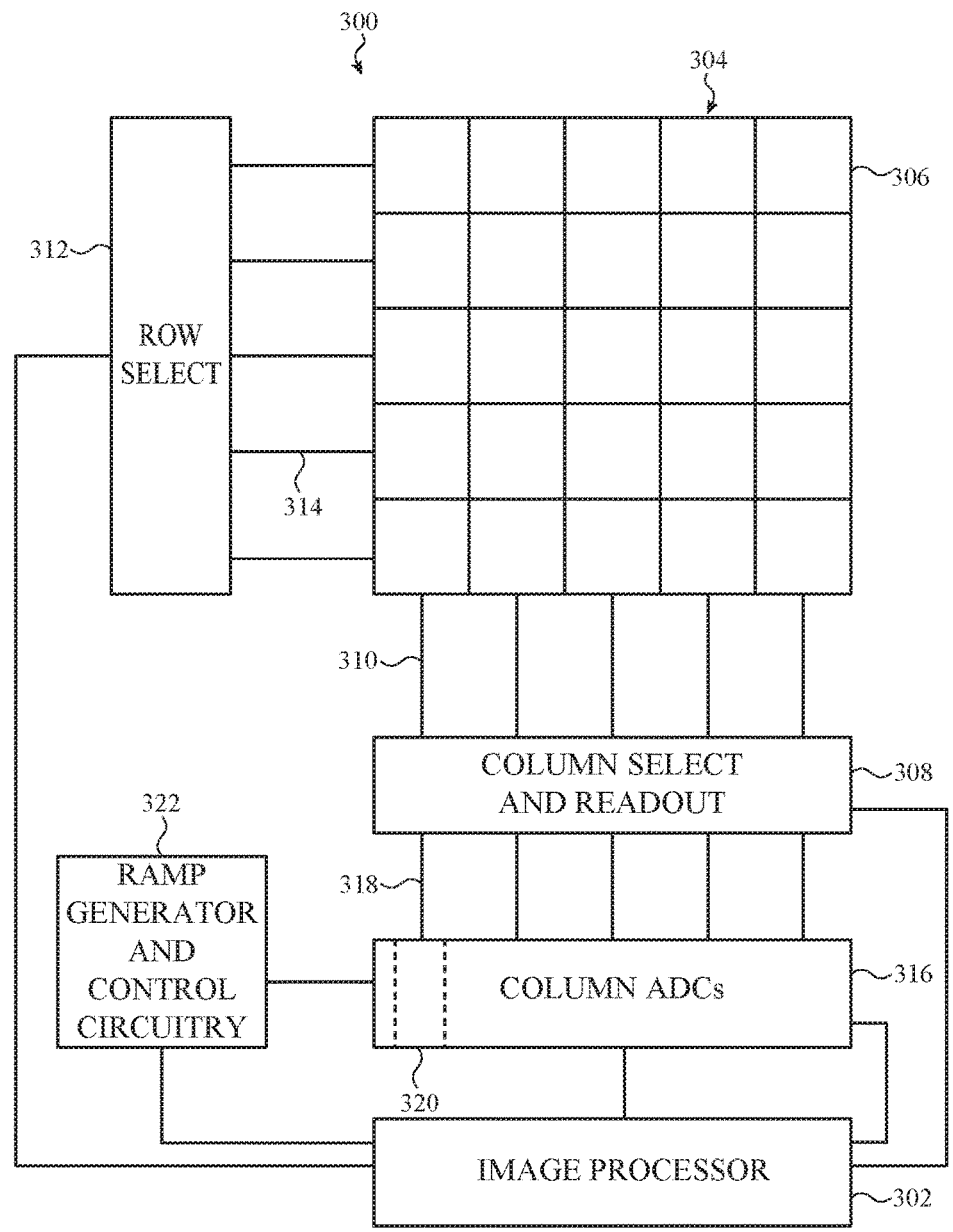
FIG. 3A shows a block diagram of one example of an image sensor that is suitable for use as the image sensor shown in FIG. 2.
Figure 12:
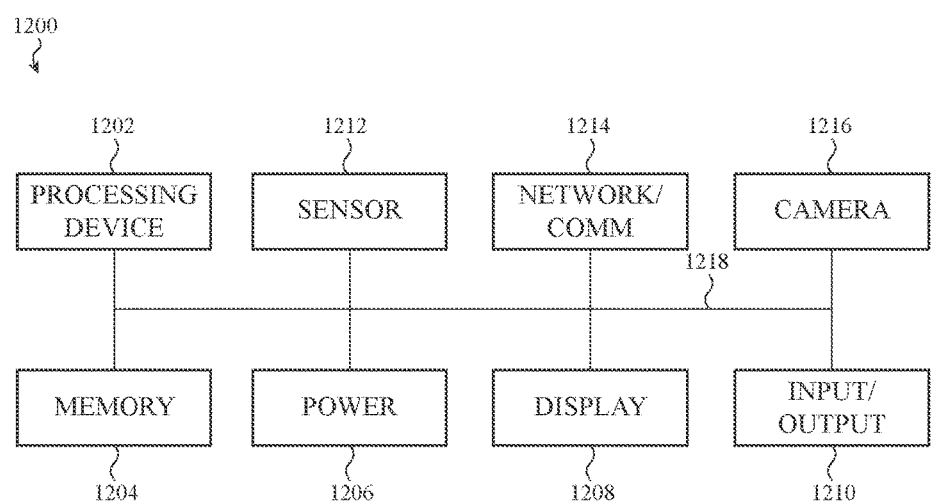
FIG. 12 shows a block diagram of an electronic device that includes an image capture device; and The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Various elements of the imaging stage 200 or the image sensor 202 can be controlled by timing signals or other signals supplied from a processor or memory (see, e.g., 302 in FIG. 3A or 1202 in FIG. 12). Some or all of the elements in the imaging stage 200 can be integrated into a single component. Additionally, some or all of the elements in the imaging stage 200 can be integrated with the image sensor 202, and possibly one or more additional elements of the electronic device 200, to form a camera module. For example, a processor or a memory may be integrated with the image sensor 202 in some embodiments.

FIG. 3A shows a block diagram of one example of an image sensor 300 that is suitable for use as the image sensor shown in FIGS. 1A, 1B, and FIG. 2. The illustrated image sensor 300 may include a complementary metal-oxide semiconductor (CMOS) image sensing pixel array 304. The architectures and methods disclosed below may also be used with image sensing pixel arrays 304 comprised of charge coupled devices, or other technologies. In the illustrated embodiment, the image sensing pixel array 304 includes multiple pixels 306 arranged in a row and column arrangement. However, other embodiments are not limited to this configuration. The pixels 306 in a pixel array 304 can be arranged in any suitable configuration, such as, for example, a hexagon configuration.

Each pixel 306 can include a photosensitive region (not shown) that accumulates charge when an image is captured. An analog signal, such as a voltage signal, is read from each pixel that represents the amount of charge accumulated by the photosensitive region. During a single analog to digital (A/D) conversion period the analog signal of a pixel is then converted to one of a finite set of quantized values which is then represented in digital form.

The pixel array 304 can be connected to column select and readout circuitry 308 through one or more output signal lines 310. The column select and readout circuitry 308 includes column circuits that each selectively receives the analog signal read from a pixel 306 in the respective column. A group of pixels, such as all of the pixels in the selected row, can be read into each of the column circuits simultaneously for any preprocessing that might be needed. This allows the analog signals from multiple pixels to be converted concurrently to digital form during a single A/D conversion period.

The pixel array 304 can also be connected to row select circuitry 312 through one or more row select lines 314. The row select circuitry 312 includes row select circuits that selectively activate particular pixels 306 or group of pixels, such as all of the pixels 306 in a selected row, so that the analog signals from the pixels in the selected row are sent over the output signal lines 310 to the select and readout circuitry 308 concurrently.

Column analog-to-digital (ADC) circuitry 316 is connected to the column select and readout circuitry 308 through one or more signal lines 318. The column ADC circuitry 316 includes column ADC circuits 320 that receive signals, such as voltage signals, from the column select and readout circuitry 308. The column ADC circuitry 316 then converts the signals into digital signals. The set of the digital signals from all the pixels forms a digital representation of the image. The column select and readout circuitry 308 can include analog front end (AFE) circuitry, such as buffer amplifiers for the voltages from the pixels 306, and correlated double sampling (CDS) circuitry. The AFE circuitry can provide signals to the column ADC circuitry 316 regarding values, such as voltage ranges or timing values, to be used by the column ADC circuitry 316 during the A/D conversion of the image. Each column ADC circuit 320 may use comparators or other comparison circuitry to produce a quantized digital value.

In some embodiments, signals from the pixels 306 in one row of the pixel array 304 undergo A/D conversion in parallel during a single A/D conversion period. In some architectures it may be that the rows are processed in parallel.

The column ADC circuitry 316 is connected to ramp generator and control circuitry 322. As is described in more detail in conjunction with FIG. 3B and FIGS. 4A-4B, the ramp generator and control circuitry 322 can include counter and control circuitry, a coarse ramp generator, a multiple-fine ramp generator, and a set of additional column ADCs and error correction circuitry.

The image sensor 300 can include an image processor 302 operatively connected to the row select circuitry 312, the column select and readout circuitry 308, the column ADC circuitry 316, and/or the ramp generator and control circuitry 322. The image processor 302 can provide signals to the row select circuitry 312 and the column select and readout circuitry 308 for the readout of the analog signals from the pixels 306. The image processor 302 may also provide control signals to the ramp generator and control circuitry 322 and the column ADC circuitry 316. The image processor 302 can also process the complete digital representation of the image received from the column ADC circuitry 316 after the A/D conversion of all the pixel values. The image sensor 300 and the image processor 302 can be a single integrated circuit, or can be separate circuits.

The column ADC circuits 316 are each configured as multiple-ramp single slope (MRSS) ADC circuits. Generally, each MRSS ADC circuit employs a two-step conversion process to perform a single complete analog-to-digital conversion: a coarse conversion step and a fine conversion step. The resolution of the MRSS ADC circuit is m+n, where m is the number of most significant bits (MSB) and n is the number of least significant bits (LSBs). The coarse step connects a single coarse ramp signal having $2^m-1$ coarse levels (e.g., voltages) to each of the comparators in the column ADC circuits 316. A single slope analog-to-digital (A/D) conversion is then performed in each column ADC circuit 320. The results of the coarse step are saved in a memory in each column ADC circuit 320.

After the coarse conversion step, a fine conversion step is performed to determine the LSBs. During the fine conversion step multiple fine ramp signals are generated concurrently to be selected for input to the column ADC circuits 316 ($2^m$ fine ramp signals with a given step size/clock cycle;

e.g., a step size/clock cycle of 1 LSB). As will be explained in more detail below in FIG. 4A, the results of the coarse step are used to connect the comparator in a respective column ADC circuit 320 to a respective fine ramp signal that corresponds to the level of its input signal (e.g., MSBs). The fine conversion calculates the LSBs over $2^n$ clock cycles. The results of the fine step are also saved in the memory in the column ADC circuits 320. The final digital output from each column ADC circuit 320 is a combination of the results of the coarse and fine conversion steps.

Because each comparator is connected to a fine ramp signal that corresponds to its input signal, each fine ramp signal only has to span $\frac{1}{2}^m$ times the ADC input range. This improves the speed of the A/D conversion process. The amount of time needed for A/D conversion process is less with the MRSS ADCs compared to single slope ADCs.

In some embodiments the coarse and/or fine ramp signals can be staircase signals, either decreasing or increasing. Alternatively, the coarse and/or fine ramp signals could be continuous linear signals.

An image sensor 202, such as the embodiment shown in FIG. 3A, can be supplemented with error correction capabilities to account for departures from the ideal operation just described. For example, offsets and drifts in the comparators, or other component drifts or inaccuracies, can cause errors, such as timing errors or voltage offset errors between the fine ramp signal (also called spacing errors). As will now be described, the various embodiments employ circuitry and methods for detection and correction of the errors in the digital output produced by non-ideal components or operation. In general, various embodiments can use not only detection of errors within each conversion step, but can also use averaging of errors over multiple conversion steps. Further, the detected errors can be used both to provide a digital correction to digital outputs, but can also be used as part of feedback circuitry to provide error correction at the analog input stage of the ADC circuitry. Together with averaging of errors, such analog feedback and adjustment of the ADC circuitry can be able to provide better than 1 LSB accuracy.

Figure 3B:
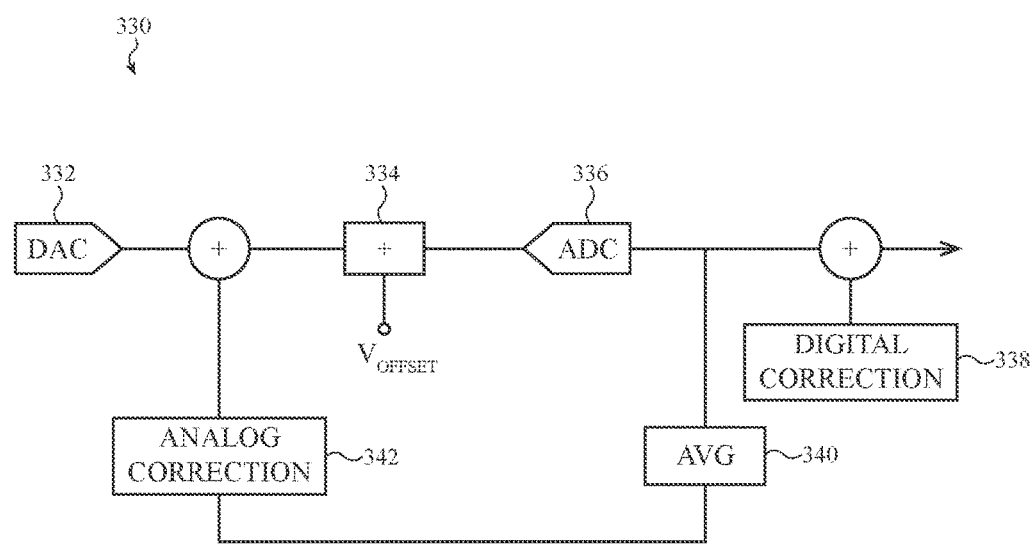
FIG. 3B shows a block diagram for error detection and correction with analog feedback.

FIG. 3B shows a structural block diagram of circuitry 330 for determining and applying such analog error correction. A more details on such embodiments will be presented in relation to FIG. 4A. In some embodiments the circuit has a digital-to-analog converter (DAC) 332 that, for example, can receive digital control signals such as from the image processor 302 of FIG. 3A. The control signals may, for example, implement a change in the full range voltage available for an analog input that is to be digitized. The control signals may also implement slope changes for either the coarse or fine ramp signals.

The analog output of the DAC is added to feedback analog corrections 342, such as may have been determined by the circuitry and methods to be described below. The sum of the two analog signals can be used to adjust 334 component inputs, such as a comparator voltage offset $V_{OFFSET}$, which is used as part of an analog-to-digital converter (ADC) 366. The ADC 336 may, for example, be the column ADC circuits 316 of FIG. 3A that receive analog inputs from an array of pixels.

The ADC 336 provides digital output, which could potentially be in error. The added error detection and correction circuitry may be able to detect that one or more bits of the output of ADC 336 are in error, and can implement digital correction 338 to the output. The digital correction 338 can be implemented within each A/D conversion cycle.

The outputs or output errors of the ADC 336 may be averaged over multiple A/D conversion cycles using averager 340. The averager 340 can provide an output to be used as part of a feedback loop and as an input to the analog correction operation 342. When initial digital corrections to the output of the ADC 336 are implemented first by the digital correction operation 388, the analog correction 342 can provide additional correction of errors in the analog to digital conversion.

Figure 4A:
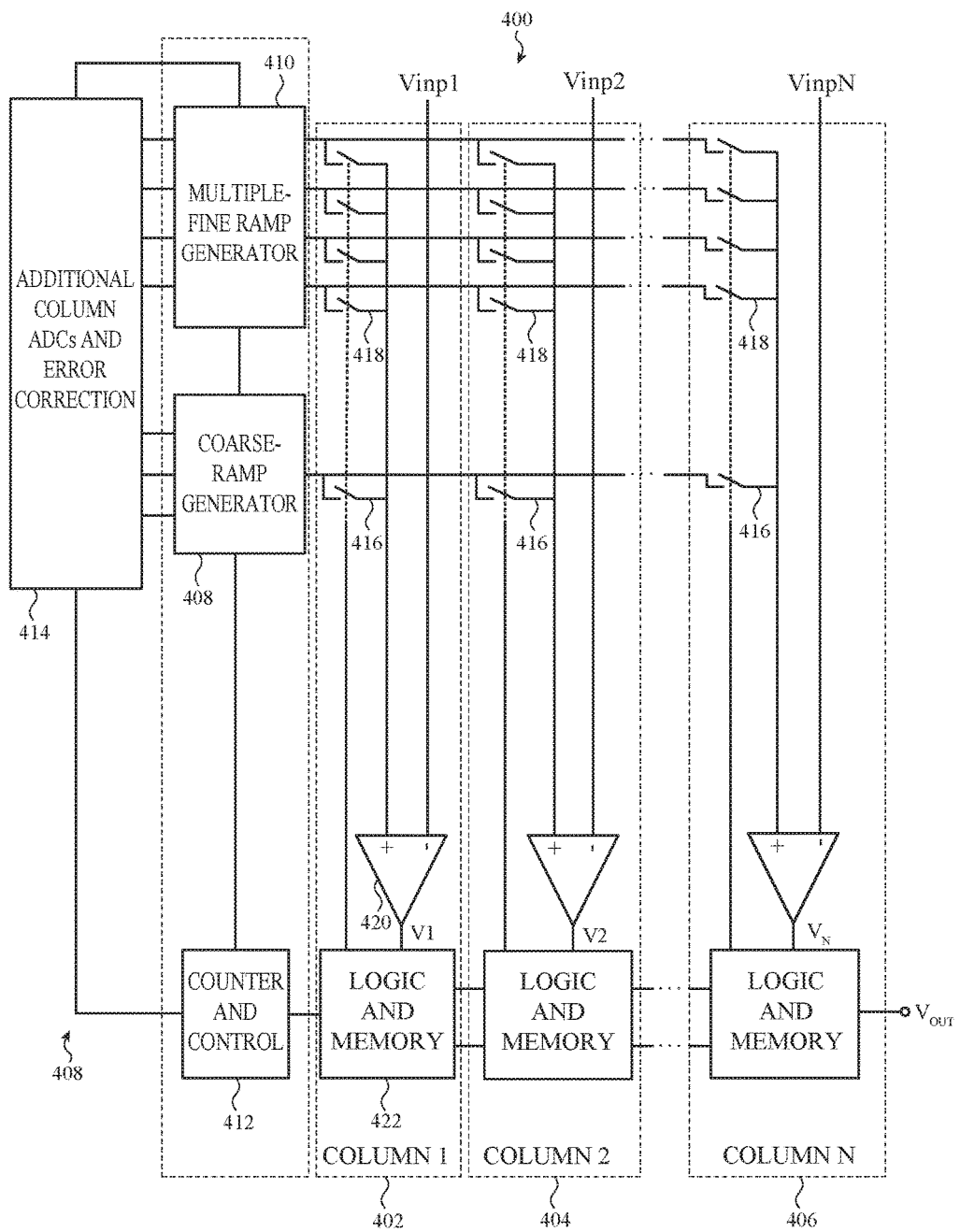
FIG. 4A shows a circuit block diagram of an example column ADC system that includes a coarse ramp generator, multiple fine ramp generator, control circuitry, additional ADCs, and error correction circuitry that are suitable for use in the image sensor shown in FIGS. 3A and 3B.

FIG. 4A shows a diagram of an example column ADC, ramp generator and control circuitry, and additional ADCs and error correction circuitry that are suitable for use in the image sensor shown in FIGS. 3A and 3B. Column ADC circuitry 400 includes N column ADC circuits that each receives respective input voltage signals Vinp1, Vinp2, . . . , VinpN from the column select and readout circuitry (e.g., 308 in FIG. 3A) and produces digital output signals. Three column ADCs circuits 402, 404, 406 are shown in FIG. 4A. Column ADC circuit 402 corresponds to column 1, column ADC circuit 404 corresponds to column 2, and column ADC circuit 406 corresponds to column N.

The coarse ramp generator 408, multiple-fine ramp generator 410, and counter and control circuitry 412 are all elements of the ramp generator and control circuitry 322 of FIG. 3A. Still with respect to FIG. 4A, the coarse ramp generator 408 produces the coarse ramp signal during the coarse step of the two-step conversion process. The multiple-fine ramp generator 410 outputs multiple fine ramp signals concurrently during the fine step of the two-step A/D conversion process.

Each column ADC circuit in the column ADC circuitry 400 includes a coarse ramp switch 416, multiple fine ramp switches 418, a comparator 420, and logic and memory circuitry 422. The analog input voltage signals Vinp1, Vinp2, and VinpN are received from the column select and readout circuitry (e.g., 308 in FIG. 3A). A first input of the comparator 420 is connected to the input voltage signal Vinp1. Similarly, input voltage signals Vinp2 to VinpN (N representing the total number of column ADC circuits) are connected to respective first inputs of the comparators in column 2 (402) to column N (406).

The coarse ramp switch 416 is configured to connect a second input of each comparator 420 to the coarse ramp generator 408. The second input of the comparator 420 is connected to the coarse ramp generator 408 during the coarse step of the two-step A/D conversion process. As described earlier, during the coarse step all of the comparators 420 are connected to a single coarse ramp signal having $2^m-1$ coarse levels (where m=MSB bits). A single slope A/D conversion is performed and the result (i.e., m bits) of each A/D conversion within each column is saved in a respective logic and memory circuitry 422 in the column ADC circuits 402, 404, 406.

The fine ramp switches 418 are each configured to transmit to the second input of the respective comparators 420 a selected fine ramp signal produced by the multiple-fine ramp generator 410. As discussed earlier, multiple fine ramp signals are produced during the fine step of the two-step A/D conversion process. The results of the coarse step are used to connect each comparator 420 to the multiple-fine ramp generator 410 and transmit a respective fine ramp signal that corresponds to the level of an input signal (e.g., Vinp1, Vinp2, . . . , VinpN). The results of the fine step are also saved in the logic and memory circuitry 422 of the each column ADC circuits 402, 404, and 406. The final digital outputs (Vout) from each column circuit 402, 404, and 406 are combinations of the results of the coarse and fine conversion steps, i.e., m+n bits.

The logic and memory circuitry 422 is also configured to enable (close) and disable (open) the coarse ramp switch 416 and each fine ramp switch 418. The logic and memory circuitry 422 enables the coarse ramp switch 416 to connect the second input of each comparator 420 to the coarse ramp generator 408. The logic and memory circuitry 422 disables the coarse ramp switch 416 at the conclusion of the coarse step.

The logic and memory circuitry 422 then enables a respective fine ramp switch 418 to connect the second input of each comparator 420 to a particular fine ramp signal. The results of the coarse step of the two-step A/D conversion are used to determine which of the fine ramp switches 418 are enabled. The logic and memory 422 disables the enabled fine ramp switches at the conclusion of the fine step.

FIG. 4A shows additional column ADCs and error correction circuitry 414 operably connected to the ramp generator and control circuitry 322. As will be described in more detail later, the additional column ADCs and error correction circuitry 414 measure errors in the coarse and/or fine ramp signals in the digital domain and compensates or corrects for such errors in the analog domain. The ADCs of the additional column ADCs and error correction circuitry 414 can be configured similarly to the column ADC circuits (e.g., 402, 404, and 406) but with the first inputs of the comparators tied to the trip levels of the coarse conversion. The additional column ADCs and error correction circuitry 414 allow for the detection and correction spacing or offset errors between the fine ramp signals.

Various operations of the coarse and multiple-fine ramp generators, the control circuitry 322, and the additional column ADCs and error correction 414 will now be described. The operations include the error measurement, the generation of ramp signals, a calibration process for the column ADC circuitry 316, and generation of corrected digital outputs representing quantizations of the input voltages received from the pixel array.

Figure 4B:
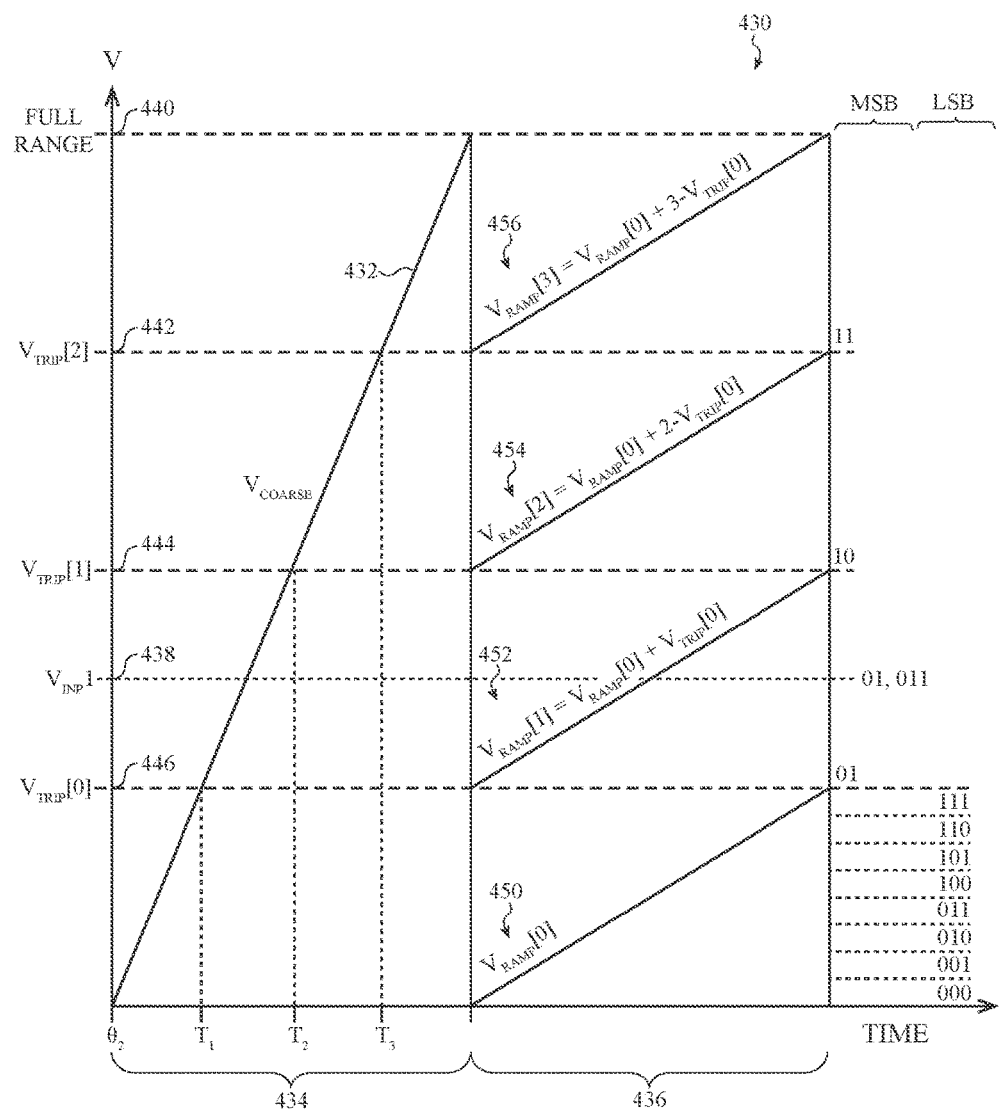
FIG. 4B shows a graph of coarse and fine ramp signals versus time in a single analog-to-digital conversion period.

FIG. 4B shows a graph 430 of coarse and fine ramp signals applied to a single column ADC circuit (such as column 402) over a single analog-to-digital (A/D) conversion period. The single A/D conversion period includes a coarse conversion step 434 that is followed by a fine conversion step 436. The column ADC circuit is configured to provide a digital output corresponding to a quantized level of the input voltage signal Vinp1 438 that is within the range from 0V to the full range (FR) voltage 440. As previously stated, during the entire A/D conversion period Vinp1 is applied to a first input of the comparator in the column ADC circuit.

During the coarse conversion step 434, a coarse ramp signal 432 is applied to the second input of the comparator. In some embodiments the coarse ramp signal 432 can linearly increase from an initial zero voltage to the FR voltage 440 during the coarse conversion step 434, as shown. However, in other embodiments the coarse ramp signal may be a staircase input. An example of such a staircase signal would output values at comparator trip (or "tripping") values; i.e., the staircase signal would have values equal: 0V during time 0 to $t_1$; value Vtrip[0] 446 during time interval $t_1$ to $t_2$; value Vtrip[1] 444 during time interval $t_2$ to $t_3$; and value Vtrip[2] 442 during time interval $t_3$ to $t_4$; with $t_4$ being the end of the coarse conversion step. Other increasing waveforms that take on the Vtrip[k] values at known times over the coarse conversion step may also be used.

In the embodiment shown, the coarse conversion step is divided into four equal time intervals, namely: 0 to $t_1$, $t_1$ to $t_2$, $t_2$ to $t_3$, and $t_3$ to $t_4$. For a linear coarse ramp signal this implies the comparator trip levels Vtrip[0], Vtrip[1], and Vtrip[2], respectively equal (¼), (½), and (¾) of the FR voltage 440. The four equal voltage intervals defined by the Vtrip[k] determine the two most significant bits of the coarse conversion step. In the case shown, m is 2.

With coarse ramp 432 and Vinp1 applied to the comparator of the ADC circuit, the comparator's outputs are measured by logic and memory circuitry, such as 422, at the times $t_1$, $t_2$, $t_3$, and $t_4$. For the values shown, the comparator first has positive output at $t_2$, so that the logic and memory circuit produces MSB values of 01, indicating that the value of Vinp1 is between Vtrip[0] and Vtrip[1], i.e., between (¼) and (½) of the FR voltage 440.

At the completion of coarse conversion step 434, the coarse ramp switch 416 is opened, thereby disconnecting the coarse ramp signal 432 from the comparator 420 of the column ADC circuit 402, and the A/D conversion continues with the fine conversion step 436. The multiple-fine ramp generator 410 then produces four fine ramp signals Vramp[0] 450, Vramp[1] 452, Vramp[2] 454, and Vramp[3] 456, one spanning each of the four equal voltage intervals used in the coarse conversion step. Ideally the four fine ramp signals would be exactly vertically offset from one another by a multiple of the same value Vtrip[0] 446, which is (¼) of the FR voltage 440.

In the embodiment shown, during the fine conversion step 436 the fine ramp signals are used to obtain n=3 LSB, i.e., each fine ramp signal is used to determine which of eight voltage subintervals of the respective coarse an input voltage signal lies. In the embodiment shown, Vramp[0] 450, for example, would be used to divide the voltage interval 0 to Vtrip[0] into eight equal subintervals. The time span of the fine conversion step 436 thus is divided into eight equal time steps.

In the embodiment shown, at the start of the fine conversion step 436, the fine ramp switch 418 closes to apply Vramp[1] to the second input of the comparator. Analogous to the operation during the coarse conversion step, the value of the comparator is taken at the end time of each time step. For the end time at which the comparator first had a positive output, the logic and memory circuit 422 produces the corresponding 3-bit output. In the embodiment shown, for Vinp1 438 and Vramp[1] 452 applied to the inputs of the comparator, the comparator has a positive output at the end of the fourth time step, indicating that Vinp1 438 is between (⅜) and (4/8) of the voltage range Vtrip[0] to Vtrip[1]. The corresponding three LSBs generated by the logic and memory circuit 422 are 011.

Either or both of the coarse ramp signal and the set of the fine ramp signals can be decreasing signals rather than increasing. Further, as mentioned in regard to the coarse ramp signal, the fine ramp signals can be staircase signals, i.e., constant during each the eight time steps but with a uniform jump at the end of each time step.

The simplified example of an MRSS ADC process just presented represents ideal behavior of all components, such as the comparators, and the coarse and multiple-fine ramp generators. Embodiments will now be presented that can measure and reduce errors produced by departures form ideal performance.

Figure 5A:
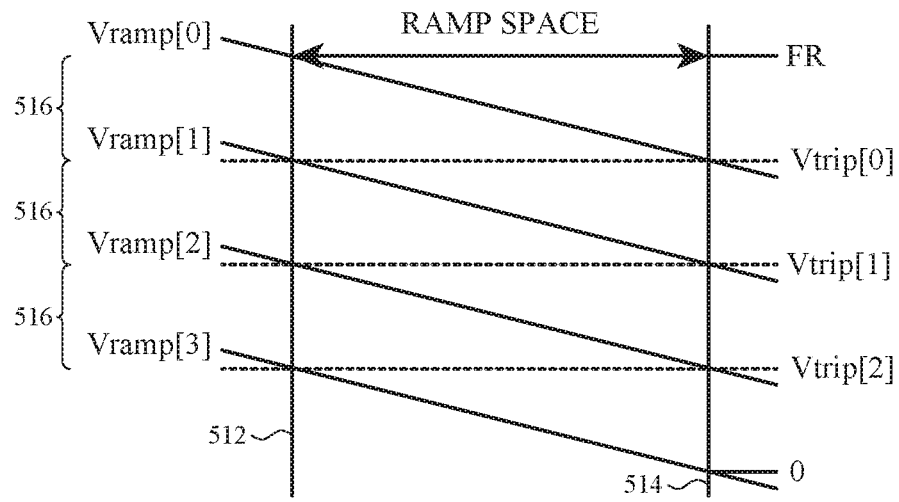
FIGS. 5A-5B are example plots showing ideal and offset errors in fine ramp signals.
Figure 5B:
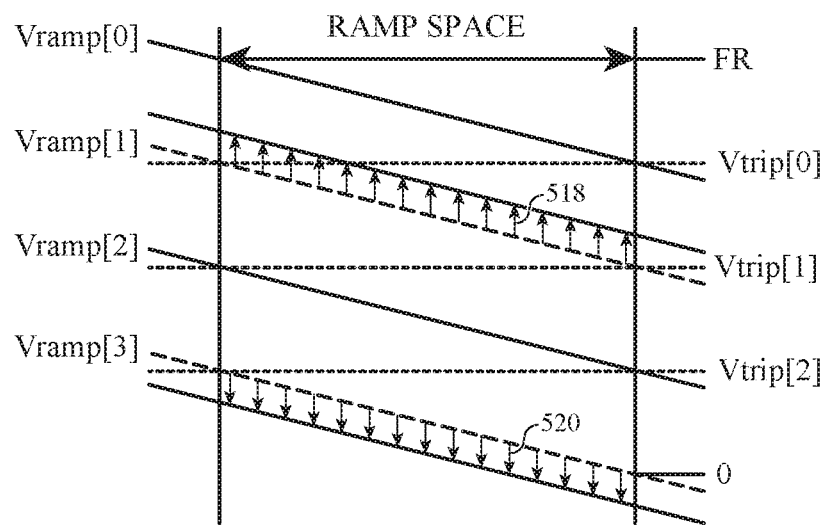

FIGS. 5A-5B are sample plots showing the effect of an analog-to-digital converter offset. FIG. 5A represents an ideal case of four decreasing fine ramp signals Vramp[0], Vramp[1], Vramp[2] and Vramp[3]. These four fine ramp signals are ideally separated by multiples of the same constant offset value 516 so that they exactly traverse the four coarse voltage intervals: FR (full range) down to Vtrip[0]; Vtrip[0] down to Vtrip[1]; Vtrip[1] down to Vtrip[2]; and Vtrip[2] down to 0V. The four fine ramp signals ideally all start exactly at the beginning of the fine conversion step, also called the ramp space, and end at the end time of the ramp space.

FIG. 5B illustrates a departure from the ideal shown in FIG. 5A, in which there is a positive offset error 518 in Vramp[1] and a negative offset error 520 in Vramp[3]. Such offset or spacing errors in the fine ramp signals can cause errors in triggering times of a comparator in a column ADC converter, leading to digital errors in one or more LSBs during the A/D process.

Figure 6A:
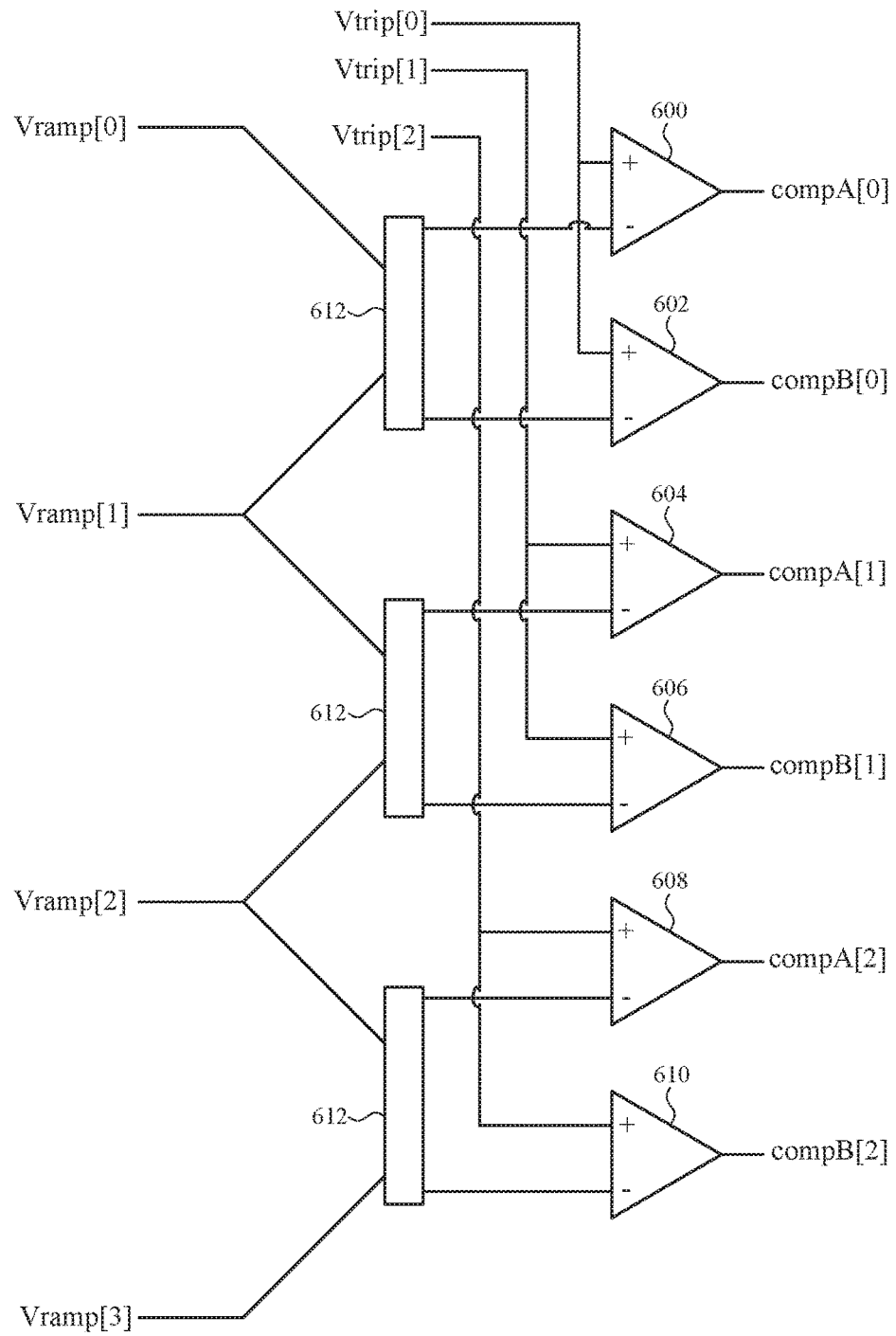
FIG. 6A depicts an example error measurement circuit that is suitable for use with the multiple-fine ramp generator shown in FIG. 4.

FIG. 6A shows a block diagram of a circuit for use in detecting offsets, errors, or inaccuracies in the fine ramp signals, according to an embodiment. The circuit shown in FIG. 6A may be part of element 414 of FIG. 4A. In the embodiment shown in FIG. 6A, six additional column ADC circuits are used beyond the original column ADC circuits of columns 1 to N shown in FIG. 4A. This reflects the fact that there are three Vtrip levels that arise from the two MSB coarse conversion step shown in FIG. 4B. In general, for a coarse conversion step configured to produce m MSBs, there will be $2^m$ coarse voltage subintervals of the full voltage range, which will have $2^m-1$ Vtrip levels. Thus there will be $2*(2^m-1)$ additional column ADC circuits. The embodiment of FIG. 6A can be used for measurements of a ramp space and offsets of it.

Ideally, the ramp space has $2^n*1[LSB]$ steps. Errors such as column ADC offset (and its drift) and coarse ramp generator offset (and its drift) can affect the ramp space, which can result in ramp space error or mismatch between the fine ramp signals. Each pair of the additional column ADC circuits can be used to measure a ramp space.

In the embodiment shown in FIG. 6A, fixed tripping signals Vtrip [0], Vtrip[1], Vtrip [2] are received by two adjacent comparators (e.g., operational amplifier comparators). In the embodiment shown, these tripping signals are voltage signals, and are determined by the coarse conversion step. Vtrip [0] is received by comparators 600 and 602. The tripping signal Vtrip [1] is received by comparators 604 and 606. Likewise, the tripping signal Vtrip [2] is received by comparators 608 and 610.

The fine ramp signals Vramp[k], for k=0 . . . 3, are swappable between two adjacent comparators. Comparators 600 and 602 can each receive the fine ramp signals Vramp[0] or Vramp[1]. Comparators 604 and 606 may each receive the fine ramp signals Vramp[1] or Vramp[2]. Further, comparators 608 and 610 can each receive the fine ramp signals Vramp[2] or Vramp[3]. Switches 612 are used to select which fine ramp signals are to be received by the respective comparators. Any suitable type of switch or switch circuitry can be used in each switch 612.

A comparison signal representing the comparison between a particular tripping signal and a particular fine ramp signal is output from each comparator. Input common mode level dependent offset can be reduced or prevented by using fixed tripping voltage signals and swappable fine ramp signals. In one embodiment, adjacent fine ramp signals are swapped between measurements.

Figure 6B:
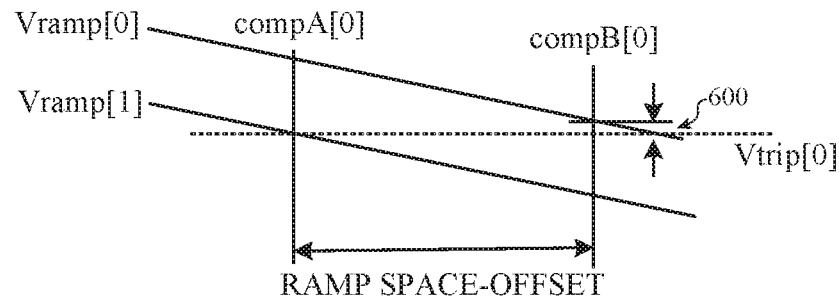
FIGS. 6B-6C show graphs for detection of errors using the circuit of FIG. 6A.
Figure 6C:
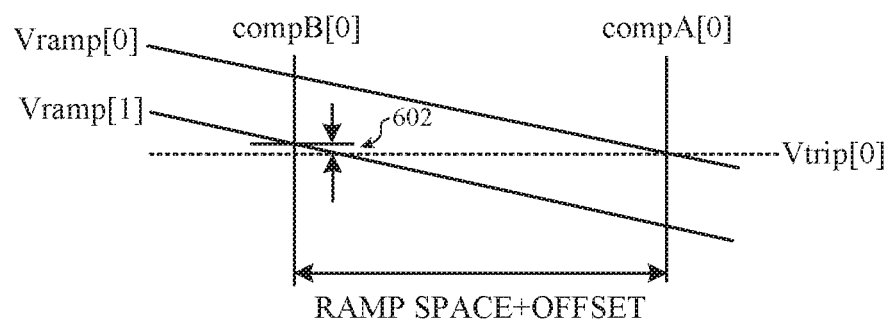

FIGS. 6B and 6C show timing graphs for determining timing and from it any common mode dependent offset errors in the fine ramp signals. The graphs in FIGS. 6B and 6C are based on the situation shown in the non-ideal case of FIG. 5B. Two measurements are made, with the timing differences of the two measurements providing a method to compensate for comparator offset.

In FIG. 6B the offset in the ramp signal Vramp[1] causes the time between on/off triggering of the comparators 600 and 602 to be shortened. This causes the time between on/off triggering of the comparators to equal the ramp space minus a time offset. For the particular case of the error shown in FIG. 5B in which Vramp[1] has a positive offset error from its ideal, with comparator 600 of FIG. 6A having inputs Vtrip[0] and Vramp[0], and comparator 602 of FIG. 6B having inputs Vtrip[0] and Vramp[1], it follows that the time from when comparator 602 turns on to the time when comparator 600 triggers on is reduced.

In FIG. 6C the offset 602 in the ramp signal Vramp[0] and Vramp[1] are swapped between the comparators 600 and 602. In this case comparator 600 of FIG. 6A has inputs Vtrip[0] and Vramp[1], with comparator 602 of FIG. 6B having inputs Vtrip[0] and Vramp[0]. This causes the time between on/off triggering of the comparators 600 and 602 to be lengthened to equal the ramp space plus a time offset. When the two timing measurements are averaged, the timing offset is canceled.

Figure 7:
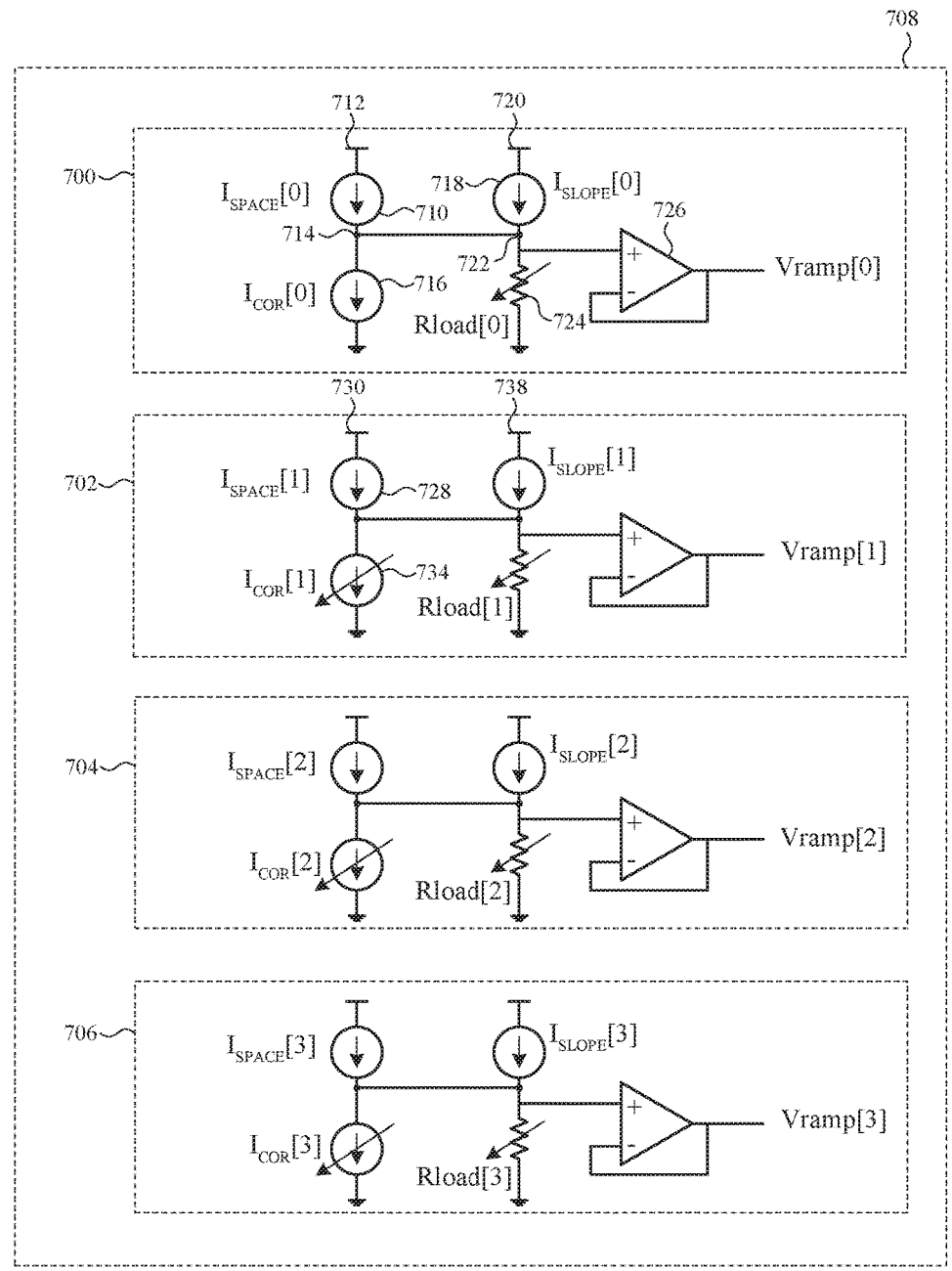
FIG. 7 depicts a schematic diagram of a first example of a multiple-fine ramp generator that is suitable for use in the multiple-fine ramp generator shown in FIG. 4.

FIG. 7 depicts a schematic diagram of a multiple-fine ramp generator 708 configured for analog adjustment of its multiple fine ramp signals. FIG. 7 illustrates four component fine ramp signal generators 700, 702, 704, 706 in the multiple-fine ramp generator 708. As will be explained below, the embodiment shown will allow for generation of all four ramp signals shown if FIG. 5A. In practice, the number of component fine ramp signal generators used in a multiple-fine ramp generator corresponds to the number of fine ramp signals to be produced. As described above, the number of fine ramp signals can be a power of 2.

The operation of the first component fine ramp signal generator 700 will now be described. The operation of other component fine ramp generators 702, 704, 706 is similar, except as noted below. The operation is based on using a central node of a bridge circuit as an input to a unity gain or buffer amplifier 726. The components of the bridge include a first signal source $I_{SPACE}[0]$ 710, which can be a current source, that connects a source 712 to the central node of the bridge at junction 714. A second signal $I_{SLOPE}[0]$ 718, which can also be a current source, connects a source 720 into the central node at junction 722. Two sinks connect the central node into the circuit ground. The first of these can be the current sink $I_{COR}[0]$, and the second can be the variable resistor $R_{LOAD}[0]$.

Component fine ramp signal generators 702, 704, 706 each have similar bridge inputs, except that for these fine ramp generators the respective sinks $I_{COR}[1]$, $I_{COR}[2]$, and $I_{COR}[3]$ are adjustable. The adjustable components in all four fine ramp signal generators can be independently adjustable.

During a single fine conversion step, in the component fine ramp signal generator 700, the signal sources 710, 716, 718 each have a fixed signal level, and the variable resistor $R_{LOAD}[0]$ 724 is used to adjust the output signal, such as an output voltage level, to produce the fine ramp signal Vramp [0]. The variation of all the load resistors $R_{LOAD}[k]$, for k=0 . . . 3, can be varied concurrently at the time steps of the fine conversion process.

The signal source $I_{SLOPE}[0]$ 718 can be set based on a desired slope of the fine ramp signals, which can be determined by the output voltage range to be spanned the fine ramp signal and the time of the fine ramp conversion step. In some embodiments the values of $I_{SLOPE}[k]$, k=0 . . . 3, is set at a common reference level.

The signal sources $I_{SPACE}[k]$, k=0 ... 3, are set to provide the relative vertical shifts in the outputs of the fine ramp signals Vramp[k], for k=0 ... 3. In one embodiment, this is accomplished by setting $I_{SPACE}[3]$ to a particular value, and then setting $I_{SPACE}[2]=2*I_{SPACE}[3]$, $I_{SPACE}[1]=3*I_{SPACE}[3]$, and $I_{SPACE}[0]=4*I_{SPACE}[3]$.

While the values of the $I_{SLOPE}[k]$ and $I_{SPACE}[k]$ are typically constant over successive fine ramp conversion steps, they can be modified to account for desired changes in the operation of imaging system, such as adjustment for changes in the ambient light detected by the camera 104, or other changes in the AFE. Such desired changes can require changes in the times for the coarse or fine conversion steps, or for the full range voltage. In some embodiments, such changes in any of the values of any of $I_{SLOPE}[k]$ and $I_{SPACE}[k]$ can be caused by signals received from the image processor 302.

The variable current sources $I_{COR}[k]$ can be used to continuously compensate for ramp space error. $I_{COR}[0]$ can be set one value, such as midpoint of its allowed range. Thereafter, the values of $I_{COR}[k]$, for k=1 ... 3, are varied based on the needed corrections as determined by the methods and circuits described above. As described above, varying $I_{COR}[k]$ allows for continuous and analog correction of spacing errors in the fine ramp signals.

Figure 8:
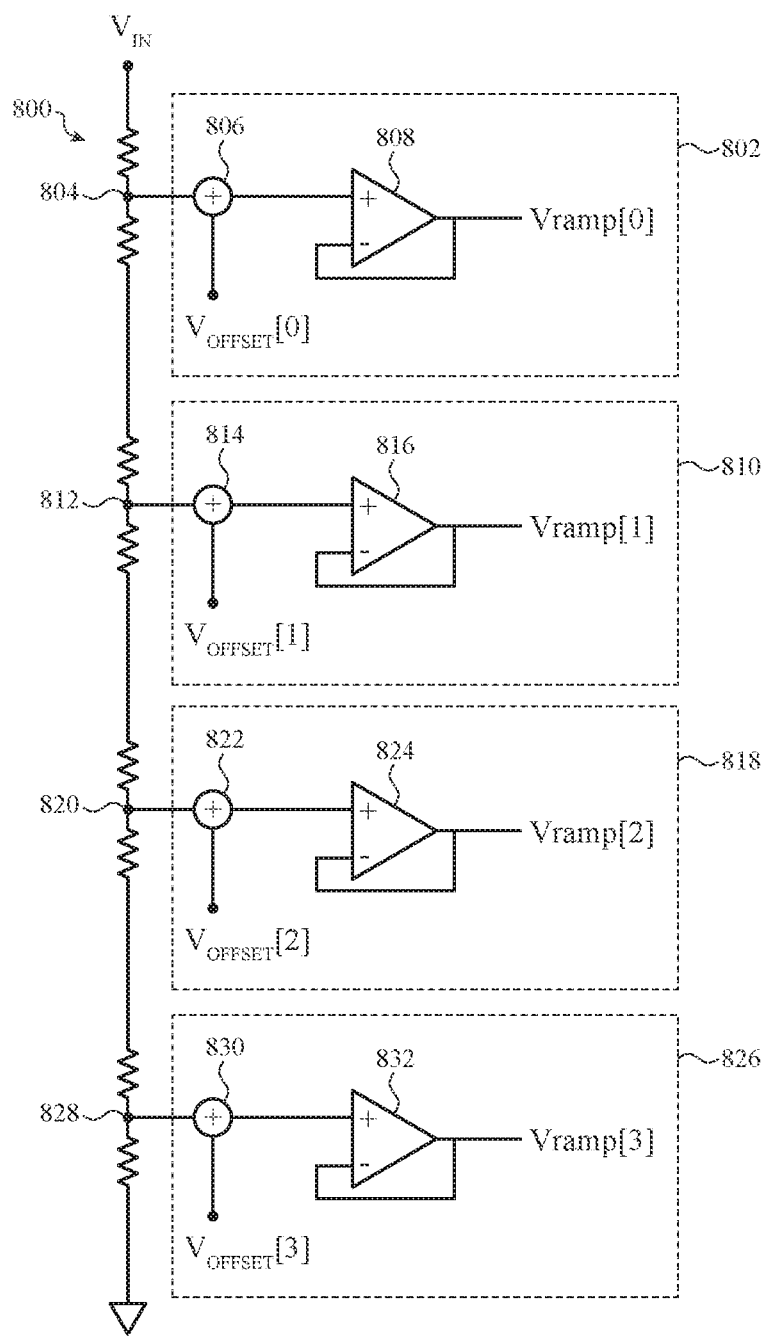
FIG. 8 depicts a schematic diagram of a second example of a multiple-fine ramp generator that is suitable for use in the multiple-fine ramp generator shown in FIG. 4.

FIG. 8 shows a schematic diagram of an alternate multiple-fine ramp generator comprising four component fine ramp signal generators 802, 810, 818, and 826. A resistance ladder is supplied by the voltage source $V_{IN}$. In the embodiment shown there are four nodes 804, 812, 820, and 828 in the resistance ladder. In general the number of nodes in the resistance ladder will equal the number of fine ramp signals needed in the particular embodiment. In an ideal case in which all resistors in the ladder have equal resistance, and the input impedances to the component fine ramp signal generators 802, 810, 818, and 826 are all effectively infinite, the respective voltages at nodes 804, 812, 820, and 828 are (7/8) $V_{IN}$, (5/8) $V_{IN}$, (3/8) $V_{IN}$, and (1/8) $V_{IN}$. Thus the differences between successive output fine ramp voltages Vramp[k] all equal (2/8) $V_{IN}$.

Each fine ramp signal can then be made to vary over time by addition of offset voltages $V_{OFFSET}[k]$, k=0 ... 3, at the summing junctions 806, 814, 822, and 830 to respective unity gain or buffer amplifiers 808, 816, 824, and 832. Generally, all fine ramp signals with equal and correct differences, as in FIG. 5A, would be produced by adding a single time-varying $V_{OFFSET}$ that decayed linearly (or with equal step size for a staircase signal) during the fine conversion step.

Departures from these ideals, such as variation in the gains or offsets of the unity gain amplifiers and in the resistances in the ladder, can produce spacing (offset) errors between the fine ramp signals, as shown in FIGS. 5B, 5C. However, by the error detection and error averaging operations discussed previously, the errors can be corrected at the analog stage by applying adjusted and possibly different offset voltages $V_{OFFSET}[k]$ at the summing junctions 806, 814, 822, and 830 to the unity gain amplifiers 808, 816, 824, and 832.

Figure 9:
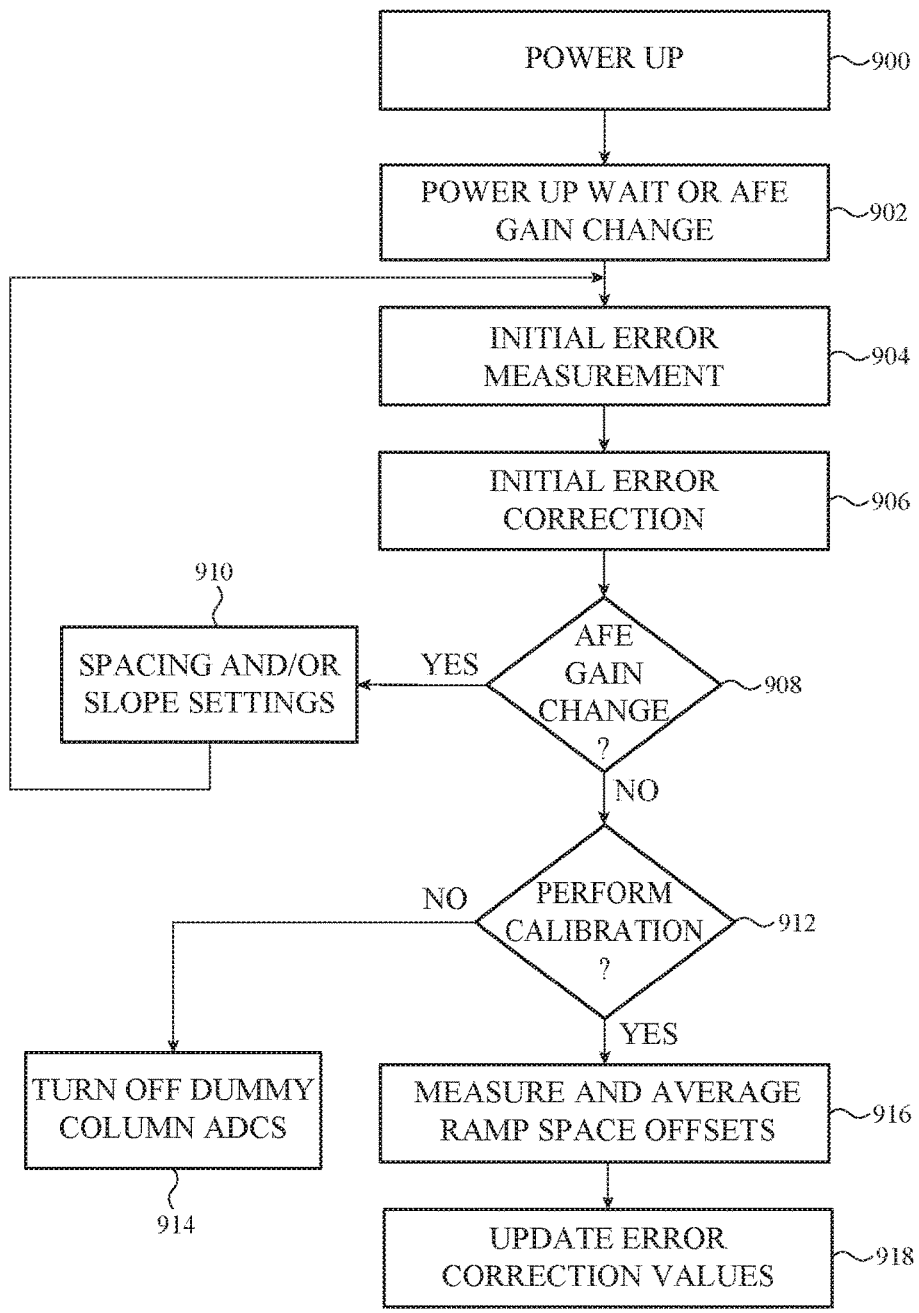
FIG. 9 shows a flowchart of operating an image sensor.

FIG. 9 shows a flowchart of a method of operating an image sensor. In some embodiments, the method in FIG. 9 operates continuously. In other embodiments, the method can operate periodically or at select times.

Initially, at stage 900, the components of the image sensor, including column ADC circuitry, row and column select circuitry, coarse and fine ramp generators, and control circuitry, are turned on. After a power-up wait time period passes, or after an analog front end (AFE) gain change, an initial error measurement is determined (stages 902 and 904). An initial error correction is then performed at stage 906.

A determination is made at stage 908 as to whether an AFE gain change has occurred. If so, the process passes to stage 910 where one or more of the values $I_{SPACE}[k]$ and $I_{SPACE}[k]$ are adjusted. For example, in one embodiment, the operations of stage 910 can be performed using the techniques disclosed in conjunction with FIGS. 7 and 8. The method then returns to stage 904.

When an AFE gain change has not occurred at stage 908, the process continues at stage 912 where a determination is made as to whether a continuous calibration process is to be performed. If not, the method passes to stage 914 where the additional column ADCs are turned off. The additional column ADCs are included in the additional column ADCs and error correction 414 in FIG. 4.

When a continuous calibration process is to be performed, the process continues at stage 916 where the ramp space error is measured over multiple A/D conversion cycles and averaged. The averaged error values are then used to determine one or more averaged error correction values. In some embodiments, the operations in stage 916 operate continuously while the calibration process is running. For example, in one embodiment, stage 916 can be performed using the technique disclosed in conjunction with FIG. 4. The averaged error correction values are then updated at stage 918 and applied to the analog stage of the A/D conversion process, such as by modifying operation of the fine ramp generators.

Figure 10:
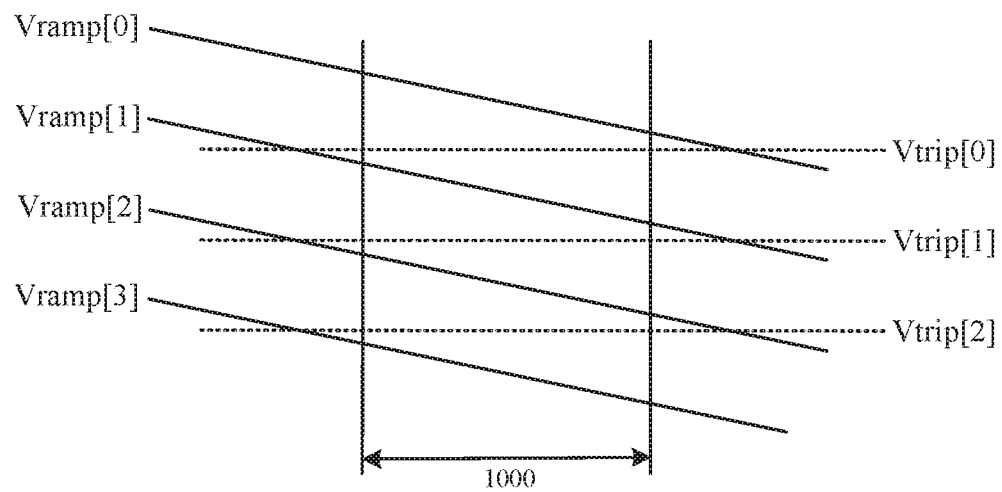
FIG. 10 depicts a first technique of performing an initial calibration.
Figure 11:
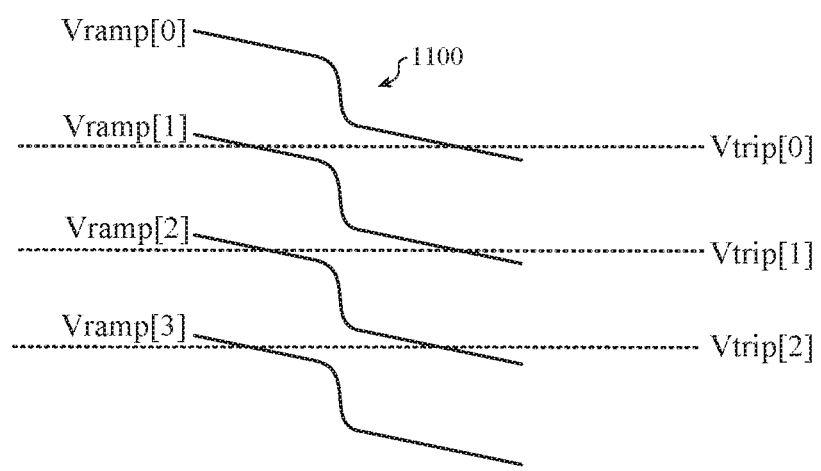
FIG. 11 depicts a second technique of performing an initial calibration.

FIGS. 10 and 11 depict a method of performing a faster initial error measurement, such as at stage 904 of the method of FIG. 9. Generally, an accurate fine ramp signal Vramp[n] is needed only around the tripping points Vtrip[n] during the initial error measurement (e.g., stage 904 in FIG. 9). In some embodiments, multiple error measurements are obtained to improve the accuracy of the measurements. To reduce the initial calibration time or initial error correction (e.g., stage 906 in FIG. 9), the fine ramp signals Vramp[n] can abruptly jump as shown in FIGS. 10 and 11.

FIG. 10 depicts the linear fine ramp signals Vramp[0] through Vramp[3] plotted against the tripping signals Vtrip[0], Vtrip[1], and Vtrip[2] of the coarse ramp signal. Section 1000 in each fine ramp signal can be skipped during the initial error measurements.

FIG. 11 shows the adjusted fine ramp signals Vramp[0] through Vramp[3]. Each fine ramp signal includes a nonlinear abrupt change, such as a jump 1100, that implement the removal or exclusion of the section 1000 shown in FIG. 10.

FIG. 12 shows a block diagram of an electronic device that includes an image capture device. The electronic device 1200 can include one or more processing devices 1202, storage or memory components 1204, a power source 1206, one or more displays 1208, one or more input/output (I/O) devices 1210, one or more sensors 1212, one or more network communication interfaces 1214, and one or more image capture devices 1216, each of which will be discussed in turn below.

The one or more processing devices 1202 can control some or all of the operations of the electronic device 1200. The processing device(s) 1202 can communicate, either directly or indirectly, with substantially all of the components of the electronic device 1200. For example, one or more system buses 1218 or other communication mechanisms can provide communication between the processing device(s) 1202, the storage or memory components 1204, the power source 1206, the display(s) 1208, the I/O device(s) 1210, the sensor(s) 1212, the network communication interface(s) 1214, and the one or more image capture devices 1216. The processing device(s) 1202 can be implemented as any electronic device capable of processing, receiving, or transmitting data or instructions. For example, the one or more processing devices 1202 can be a microprocessor, a central processing unit (CPU), an application-specific integrated circuit (ASIC), a digital signal processor (DSP), or combinations of multiple such devices. As described herein, the term "processing device" is meant to encompass a single processor or processing unit, multiple processors, multiple processing units, or other suitably configured computing element or elements.

In some embodiments, the image processor 302 (FIG. 3A) can be incorporated into the one or more processing devices 1202. In other embodiments, the image processor 302 is separate from the processing device(s) 1202. And in still other embodiments, the operations and processing performed by the image processor 302 can be distributed between the image processor 702 and the processing device(s) 1202.

The memory 1204 can store electronic data that can be used by the electronic device 1200. For example, the memory 1204 can store electrical data or content such as, for example, audio files, document files, timing signals, control signals, algorithms, and image data. In one embodiment, the memory 1204 stores instructions that when executed by a processor (such as image processor 302 in FIG. 3A) or by the one or more processing devices 1202, perform the calibration method shown in FIG. 9 and/or the measurement operations and/or the correction operations discussed herein. In other embodiments, a separate memory can be included in or connected to the image processor 302 (FIG. 3A) and store the instructions that when executed, perform the calibration method shown in FIG. 9 and/or the measurement operations and/or the correction operations discussed herein.

The memory 1204 can be configured as any type of memory. By way of example only, memory 1204 can be implemented as random access memory, read-only memory, Flash memory, removable memory, or other types of storage elements, in any combination.

The power source 1206 can be implemented with any device capable of providing energy to the electronic device 1200. For example, the power source 1206 can be a battery or a connection cable that connects the electronic device 1200 to another power source such as a wall outlet.

The one or more displays 1208 may provide an image or video output for the electronic device 1200. The display(s) 1208 can be substantially any size and may be positioned substantially anywhere on the electronic device 1200. In some embodiments, the display(s) 1208 can each be a liquid crystal display element, a plasma display element, or a light emitting diode display element. At least one display 1208 may also function as an input device that is configured to receive touch and/or force inputs. For example, the display 1208 can include capacitive touch sensors, infrared touch sensors, and the like that may capture a user's input to the display. In these embodiments, a user may press on the display 1208 in order to provide input to the electronic device 1200.

In some embodiments, the one or more input/output devices 1210 can receive data from a user or one or more other electronic devices. The I/O device(s) 1210 can include a touch sensing input surface such as a track pad, one or more buttons, one or more microphones or speakers, and/or a keyboard.

The one or more sensors 1212 can by implemented with any type of sensor. Examples sensors include, but are not limited to, light sensors and/or light detection sensors, biometric sensors (e.g., fingerprint sensor), gyroscopes, accelerometers, force sensors, proximity sensors, and/or touch sensors. The sensor(s) 1212 can be used to provide data to the processing device(s) 1202, which may be used to enhance or vary functions of the electronic device.

The one or more network communication interfaces 1214 can facilitate the transmission and/or receipt of data to or from other electronic devices. For example, in embodiments where the electronic device 1200 is a smart telephone, the network communication interface(s) 1214 can receive data from a network or send and transmit electronic signals via a wireless or wired connection. Example wireless and wired connections include, but are not limited to, cellular, Wi-Fi, Bluetooth, and Ethernet. In one or more embodiments, a single network communication interface 1214 supports multiple network or communication mechanisms. For example, a single network communication interface 1214 can pair with another device over a Bluetooth network to transfer signals to the other device while simultaneously receiving signals from a Wi-Fi or other wired or wireless connection.

The one or more image capture devices 1216 can be used to capture images or video. One example of an image capture device is a camera. At least one image capture device 1216 can include an image sensor as disclosed herein. The image sensor can be implemented as any suitable image sensor, such as a complementary metal-oxide-semiconductor (CMOS) image sensor or a charge coupled device. As described earlier, the image capture device(s) 1216 can include an imaging stage that is in optical communication with the image sensor. The imaging stage may include conventional elements such as a lens, a filter, an iris, and a shutter. Various elements of the image capture device(s) 1216, such as the imaging stage and/or the image sensor, can be controlled by timing signals or other signals supplied from the processing device(s) 1202, the image processor 302 (FIG. 3A), and/or the memory 1204.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An image sensor comprising:
an array of pixels configured in multiple columns;
a multiple-ramp single slope analog-to-digital conversion circuit operatively connected to the array of pixels and comprising:
a respective column analog-to-digital converter (ADC) for each of the multiple columns, each column ADC configured to receive a signal generated from a pixel in its column as a first input;
a coarse ramp generator operative to apply a coarse ramp signal as a second input to each column ADC during a coarse conversion step within an analog to digital conversion period; and
a plurality of fine ramp generators, each fine ramp generator operative to apply a respective fine ramp signal as the second input to each column ADC during a fine conversion step within the analog to digital conversion period;

a plurality of additional column ADCs configured to measure the fine ramp signals;

an error detection circuit operative to determine an error in at least one fine ramp signal, based on outputs from the plurality of additional column ADCs; and feedback circuitry operative to modify an operation of at least one fine ramp generator based on the error determined by the error detection circuit.

2. The image sensor of claim 1, wherein the error detection circuit is operative to:

apply a first fine ramp signal and a trip level of the coarse ramp signal to a first comparator;

apply a second fine ramp signal and the trip level of the coarse ramp signal to a second comparator;

measure a first time between triggering of the first comparator and triggering of the second comparator;

apply the second fine ramp signal and the trip level of the coarse ramp signal to the first comparator;

apply the first fine ramp signal and the trip level of the coarse ramp signal to the second comparator;

measure a second time between triggering of the first comparator and triggering of the second comparator; and average the first measured time and the second measured time; wherein:

the first fine ramp signal and the second fine ramp signal are adjacent fine ramp signals.

3. The image sensor of claim 2, wherein:

the first comparator is a component of a first of the additional column ADCs;

the second comparator is a component of a second of the additional column ADCs;

the first measured time is during a first fine conversion step; and the second measured time is during a next fine conversion step after the first fine conversion step.

4. The image sensor of claim 1, wherein the feedback circuitry is operative to modify an offset voltage of at least one of the plurality of fine ramp generators.

5. The image sensor of claim 1, wherein the feedback circuitry is operative to modify a current source of at least one of the plurality of fine ramp generators.

6. The image sensor of claim 1, wherein the error detection circuit is operative to average errors in at least one ramp signal determined during each of multiple analog to digital conversion periods.

7. The image sensor of claim 6, wherein the averaged errors are used to modify digital output of a column ADC.

8. The image sensor of claim 6, wherein the averaged errors are used to modify operation of the fine ramp generators.

9. A method of operating an image sensor that includes multiple-ramp single slope analog-to-digital converters (ADCs), and additional ADCs, the method comprising:

receiving an initiation signal;

using the additional column ADCs to perform an initial error measurement of ramp signals produced by a set of ramp generators;

performing an initial analog error correction on at least one of the set of ramp generators;

performing a subsequent error measurement of the ramp signals, using the additional column ADCs, during operation of the image sensor; and performing a subsequent analog error correction on at least one of the set of ramp generators;

wherein:

the initial and subsequent analog error corrections comprise at least one of adjusting an offset voltage applied to one of the set of ramp generators or adjusting a current source within one of the set of ramp generators.

10. The method of operating an image sensor of claim 9, further comprising:

receiving a signal from an analog front end associated with the image sensor; and changing a property of at least one of the set of ramp generators based on the received signal value.

11. The method of operating an image sensor of claim 10, wherein the signal from the analog front end comprises is of a change in a gain of an amplifier in the analog front end.

12. The method of operating an image sensor of claim 10, wherein changing the property of at least one of the set of ramp generators comprises adjusting one of a setting for a spacing between ramp signals or a setting for a slope of the ramp signals.

13. The method of operating an image sensor of claim 9, further comprising:

receiving a signal indicating an end of error measurement of the ramp signals; and reducing power applied to the additional column ADCs.

14. The method of operating an image sensor of claim 9, wherein, during the initial error measurement, a first ramp signal exhibits a nonlinear abrupt change.

15. The method of operating an image sensor of claim 9, further comprising:

performing subsequent error measurements of the ramp signals using the additional column ADCs during each of multiple analog to digital conversion periods;

averaging the error measurements; and modifying an operation of at least one of the set of ramp generators based on the averaged error measurements.

16. An electronic device comprising:

a camera comprising:

an image sensor operative to capture a digital representation of an image; and an image processor operative to control an operation of the image sensor;

wherein the image sensor comprises:

an array of pixels;

a multiple-ramp single slope analog-to-digital conversion circuit linked with the array of pixels comprising:

a first set of column analog-to-digital converters (ADCs);

a coarse ramp generator operative to apply a coarse ramp signal to the first set of column ADCs; and a plurality of fine ramp generators, each fine ramp generator operative to apply a respective fine ramp signal to the first set of column ADCs;

a second set of column ADCs configured to measure the fine ramp signals;

an error detection circuit operative to determine an error in at least one fine ramp signal based on outputs from the second set of column ADCs; and feedback circuitry operative to provide an analog signal, based on the error determined by the error detection circuit, to at least one of the plurality of fine ramp generators to modify the fine ramp signal applied by the at least one fine ramp generator.

17. The electronic device of claim 16, wherein each of the second set of column ADCs comprise a comparator operative to:
  form a first comparison between a trip level of the coarse ramp signal to a first fine ramp signal; and
  form a second comparison between the trip level of the coarse ramp signal to a second fine ramp signal;
  wherein the first fine ramp signal and the second fine ramp signal are adjacent.

18. The electronic device of claim 16, wherein the feedback circuitry is operative to perform at least one of modifying an offset voltage of at least one of the plurality of fine ramp generators or modifying a current source of at least one of the plurality of fine ramp generators.

19. The electronic device of claim 16, wherein the error detection circuit is operative to average errors in at least one fine ramp signal determined during each of multiple analog to digital conversion periods.

20. The electronic device of claim 19, wherein the feedback circuitry is operative to modify the operation of the fine ramp generators based on the averaged errors.

\* \* \* \* \*